(12) United States Patent
Kiyotoshi

(10) Patent No.: US 8,013,317 B2
(45) Date of Patent: Sep. 6, 2011

(54) NONVOLATILE STORAGE DEVICE AND METHOD FOR MANUFACTURING SAME

(75) Inventor: Masahiro Kiyotoshi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/408,510

(22) Filed: Mar. 20, 2009

(65) Prior Publication Data
US 2009/0283737 A1    Nov. 19, 2009

(30) Foreign Application Priority Data

May 19, 2008  (JP) ................... 2008-131200

(51) Int. Cl.
*H01L 29/02* (2006.01)
(52) U.S. Cl. .. 257/2; 257/3; 257/4; 257/5; 257/E29.002; 438/102; 438/103; 438/197
(58) Field of Classification Search .................. 257/2–5, 257/E29.002; 438/102–103, 197; 365/163
See application file for complete search history.

(56) References Cited

U.S. PATENT DOCUMENTS

| | | |
|---|---|---|
| 2004/0114413 A1* | 6/2004 | Parkinson et al. ............ 365/100 |
| 2007/0215977 A1 | 9/2007 | Lee et al. |
| 2008/0073635 A1 | 3/2008 | Kiyotoshi et al. |
| 2008/0074989 A1* | 3/2008 | Kariyada ..................... 369/286 |

FOREIGN PATENT DOCUMENTS

| | | |
|---|---|---|
| JP | 2004-186553 | 7/2004 |
| JP | 2006-127583 | 5/2006 |
| JP | 3913258 | 2/2007 |
| KR | 10-0723569 | 5/2007 |
| KR | 10-2007-0092502 | 9/2007 |

OTHER PUBLICATIONS

Notification of Comments issued by the Korean Patent Office on Jan. 25, 2011, for Korean Patent Application No. 10-2009-43199, and English-language translation thereof.

* cited by examiner

*Primary Examiner* — Jami M Valentine
(74) *Attorney, Agent, or Firm* — Finnegan, Henderson, Farabow, Garrett & Dunner, L.L.P.

(57) ABSTRACT

A nonvolatile storage device having a plurality of unit memory layers, and a plurality of layer selection transistors is provided. The plurality of unit memory layers are laminated in a direction perpendicular to a layer surface of the unit memory layers. Each of the unit memory layers includes a plurality of first wirings, a plurality of second wirings provided non-parallel to the plurality of first wirings, and a recording layer provided between the plurality of first wirings and the plurality of second wirings. The plurality of layer selection transistors are connected to at least one of the plurality of first wirings and the plurality of second wirings of each of the unit memory layers, and collectively selects the at least one in the same plane.

19 Claims, 16 Drawing Sheets

NONVOLATILE STORAGE DEVICE AND METHOD FOR MANUFACTURING SAME

CROSS-REFERENCE TO RELATED APPLICATIONS

This application is based upon and claims the benefit of priority from the prior Japanese Patent Application No. 2008-131200, filed on May 19, 2008; the entire contents of which are incorporated herein by reference.

BACKGROUND OF THE INVENTION

1. Field of the Invention

This invention relates to a nonvolatile storage device and a method for manufacturing the same.

2. Background Art

Nonvolatile memory typified by NAND flash memory is used widely for large-capacity data storage in mobile telephones, digital still cameras, USB memory, silicon audio, and the like. The market continues to grow due to the reduction of manufacturing costs per bit enabled by rapid miniaturization. However, NAND flash memory utilizes a transistor operation that records information using a threshold shift. It is considered that further improvements to uniformity of characteristics, reliability, high-speed operations, and integration will reach a limit. The development of a new nonvolatile memory is desirable.

On the other hand, for example, phase change memory elements and resistance change elements operate by utilizing a variable resistance state of a resistive material. Therefore, a transistor operation is unnecessary during writing/erasing, and the element characteristics improve as the size of the resistive material is reduced. Hence, this technology is expected to respond to future needs by realizing highly uniform characteristics, high reliability, high-speed operations, and high density.

However, phase change memory elements and resistance change elements are different than NAND flash memory in that independent control of word lines and bit lines is necessary. The number of contacts and wirings connecting to the peripheral circuit undesirably increases as the number of laminated memory layers increases. Therefore, the draw-out to the peripheral circuit is, unfortunately, extremely difficult in the case where the number of laminations is increased.

JP-A 2004-186553 (Kokai) discusses technology to read stored data at high speeds and stabilize operations by providing a selection element including a MOSFET or a diode element that performs a common selection of a plurality of variable resistance elements in a memory cell array formed by variable resistance elements. However, consideration is not given to laminated memory layers, and conventional art does not easily enable a draw-out to the peripheral circuit in a nonvolatile storage device that includes laminated memory layers.

SUMMARY OF THE INVENTION

According to an aspect of the invention, there is provided a nonvolatile storage device including: a plurality of unit memory layers, and a plurality of layer selection transistors; the plurality of unit memory layers being laminated in a direction perpendicular to a layer surface of the unit memory layers; each of the unit memory layers including a plurality of first wirings, a plurality of second wirings provided non-parallel to the plurality of first wirings, and a recording layer provided between the plurality of first wirings and the plurality of second wirings; and the plurality of layer selection transistors being connected to at least one of the plurality of first wirings and the plurality of second wirings of each of the unit memory layers, the plurality of layer selection transistors collectively selecting the at least one in the same plane.

According to another aspect of the invention, there is provided a method for manufacturing a nonvolatile storage device, the nonvolatile storage device including a plurality of unit memory layers laminated in a direction perpendicular to a layer surface of the plurality of unit memory layers, and each of the plurality of unit memory layers including a first wiring, a second wiring provided non-parallel to the first wiring, and a recording layer provided between the first wiring and the second wiring; including: forming a plurality of layer selection transistors on a semiconductor substrate; forming the unit memory layers; and connecting at least one of the first wirings and the second wirings of each layer of the unit memory layers to the layer selection transistors, respectively.

DETAILED DESCRIPTION OF THE INVENTION

Figure 1:
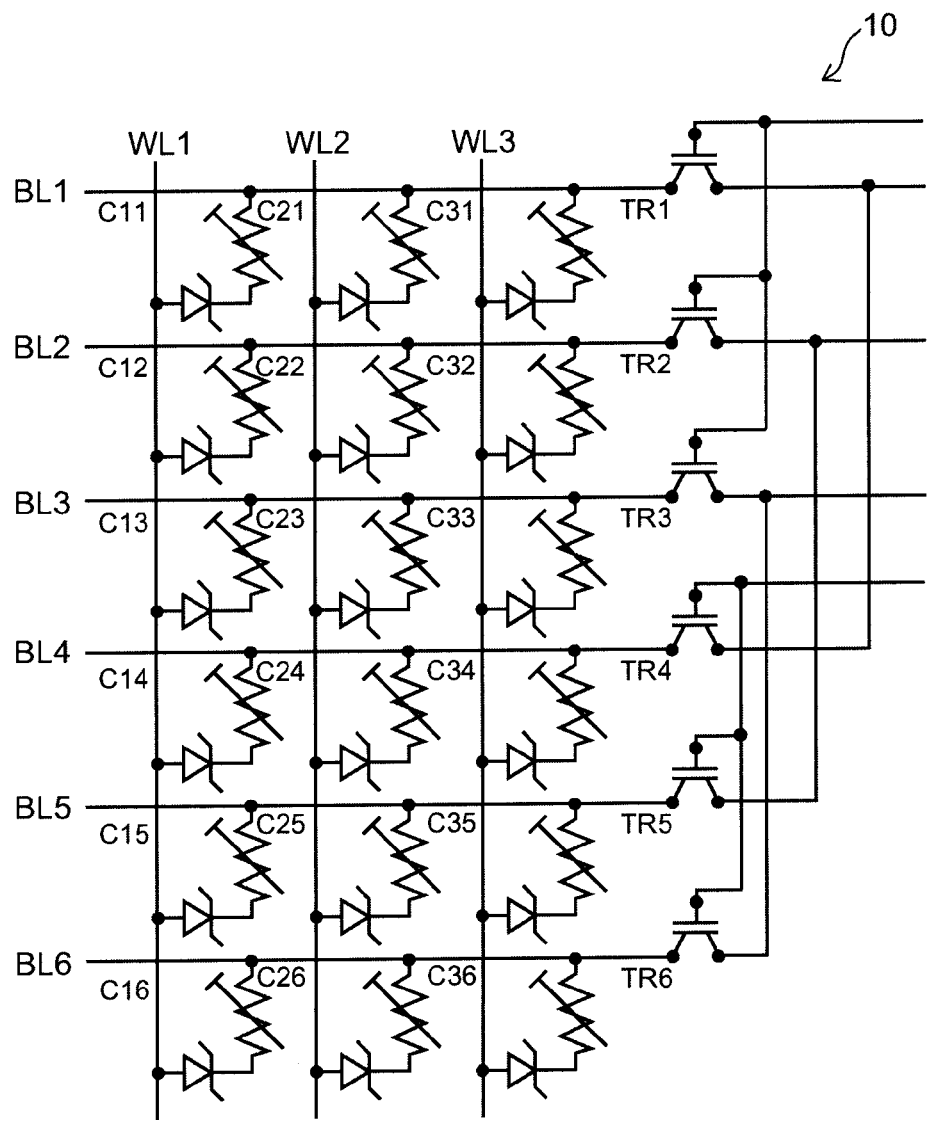
FIG. 1 is a circuit configuration diagram illustrating a structure of a nonvolatile storage device according to a first embodiment of the invention.

Hereinbelow, embodiments of the present invention are described in detail with reference to the drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a circuit configuration diagram illustrating a structure of a nonvolatile storage device according to a first embodiment of the present invention.

Figure 2:
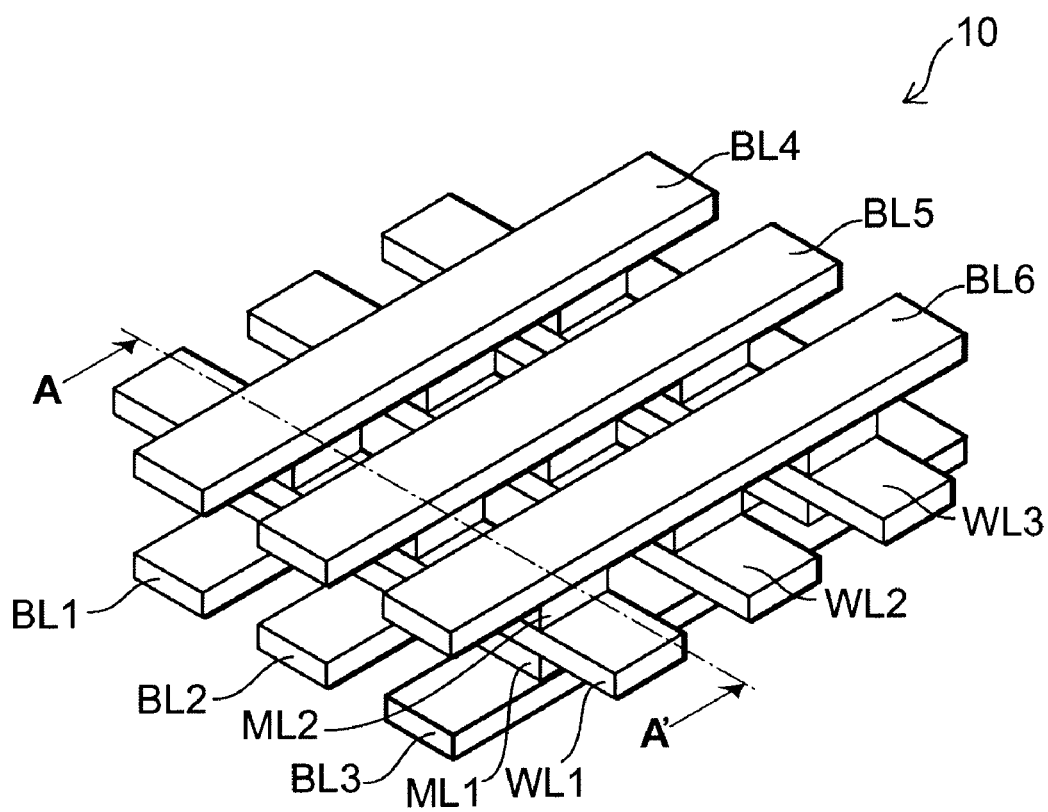
FIG. 2 is a schematic perspective view illustrating the structure of the nonvolatile storage device according to the first embodiment of the invention.

FIG. 2 is a schematic perspective view illustrating the structure of the nonvolatile storage device according to the first embodiment of the present invention.

As illustrated in FIG. 1 and FIG. 2, a nonvolatile storage device 10 according to the first embodiment of the present invention includes a resistance change memory having two laminated crosspoint cell layers. Each nonvolatile memory element includes a plurality of unit cells C11, C12, C13, C14, C15, C16, C21, C22, C23, C24, C25, C26, C31, C32, C33, C34, C35, and C36 arranged in a matrix configuration. Each unit cell is defined by a plurality of bit lines BL1, BL2, BL3, BL4, BL5, and BL6, and by a plurality of word lines WL1, WL2, and WL3. At each crosspoint, where a word line and a bit line intersect three dimensionally, for example, a variable resistance element, i.e., a recording layer, forms each of the unit cells C11 to C16, C21 to C26, and C31 to C36. Each of these variable resistance elements is laminated with a rectifying element (for example, a diode) to form a laminated structure. The laminated structure is disposed between each of the word lines and the bit lines.

Thus, the bit lines BL1, BL2, and BL3, recording layers ML1 of a first layer, and the word lines WL1, WL2, and WL3 form the first unit memory layer. The word lines WL1, WL2, and WL3, recording layers ML2 of a second layer, and the bit lines BL4, BL5, and BL6 form a second unit memory layer.

In the nonvolatile storage device 10, a plurality of such unit memory layers are stacked on one another in a direction perpendicular to a surface of the layer (for example, a recording layer of a unit memory layer).

The word lines are common to the first unit memory layer and the second unit memory layer.

In FIG. 1 and FIG. 2, three first layer bit lines, three second layer bit lines, and three word lines are illustrated; but the number of bit lines and word lines in each layer is arbitrary.

As described below, the number of unit memory layers stacked on one another also is arbitrary. To simplify the description below, an example is described having two memory layers with three of each line type.

As illustrated in FIG. 1, the nonvolatile storage device 10 according to the first embodiment of the present invention includes layer selection transistors.

Namely, the nonvolatile storage device 10 is provided wherein a unit memory layer includes a first wiring, a second wiring provided non-parallel to the first wiring, and a storage layer provided between the first wiring and the second wiring; and a plurality of the unit memory layers are stacked on one another in a direction perpendicular to a layer surface of the unit memory layer. A plurality of first wirings and second wirings are provided in each of the unit memory layers. Layer selection transistors are connected to at least one of the first wirings and the second wirings of each of the unit memory layers, and collectively select the at least one in the same plane.

The recording layers may use a material having a resistance that changes due to a voltage applied to the recording layer by the first wiring and the second wiring. In other words, the recording layers may use a resistance change element (resistance change material) or a phase change memory element (phase change material) that can reversibly transition between a first state and a second state due to a current supplied via the first wiring and the second wiring, where the second state has a different resistance than that of the first state. Materials usable in the recording layer are described below.

In the description recited above, for example, the first wiring may be assumed to be a word line, and the second wiring may be assumed to be a bit line. Conversely, the second wiring may be assumed to be a word line, and the first wiring may be assumed to be a bit line. That is, it is possible to mutually interchange the first wiring and the second wiring.

Layer selection transistors TR1, TR2, and TR3 are provided to select the recording layers of the first layer; layer selection transistors TR4, TR5, and TR6 are provided to select the recording layers of the second layer; and the laminated recording layers are selected by the layer selection transistors TR1 to TR6.

The gate electrodes of the layer selection transistors TR1, TR2, and TR3 that select the recording layers of the first layer have a mutually common potential. The gate electrodes of the layer selection transistors TR4, TR5, and TR6 that select the recording layers of the second layer also have a mutually common potential. Thereby, it is possible to collectively select three bit lines of the same unit memory layer.

Accordingly, a common bit line can be used to draw out from the bit lines BL1 and BL4, BL2 and BL5, and BL3 and BL6. When reading or writing the first layer bit lines BL1 to BL3, the layer selection transistors TR1 to TR3 are selected; and when reading or writing the second layer bit lines BL4 to BL6, the layer selection transistors TR4 to TR6 are selected. Hence, it is possible to read or write any recording layer (cell) of any unit memory layer.

In this specific example, a plurality of gate electrodes of the layer selection transistors, which select recording layers in the same unit memory layer from a plurality of unit memory layers, are mutually electrically connected.

Here, one of the first wirings and the second wirings in one of the plurality of unit memory layers, and one of the first wirings or the second wirings in another of the plurality of unit memory layers, are connected to the same wiring.

Thus, by providing layer selection transistors in the nonvolatile storage device 10, the number of bit lines ultimately drawn out does not increase even in the case where the number of laminated memory layers (unit memory layers) increases. In other words, layer selection transistors combine bit lines of each memory layer, and therefore the number of bit lines ultimately drawn out does not vary. Consequently, the number of laminated memory layers can be increased without drastically modifying the peripheral circuit.

A transistor having any appropriate function and structure may be used as the layer selection transistor.

For example, layer selection transistors may have a function that collectively selects word lines or bit lines in a plane parallel to a major surface of a substrate. The major surface of the substrate is parallel to the layer surface of the unit memory layer. In other words, layer selection transistors can collectively select at least one of the first wirings and the second wirings in the plane parallel to the layer surface of the unit memory layer. The nonvolatile storage device 10 illustrated in FIG. 1 is an example where layer selection transistors collectively select bit lines in a plane parallel to a layer surface of the unit memory layer.

Additionally, layer selection transistors may have a function that collectively selects word lines or bit lines in a plane perpendicular to the major surface of the substrate. In other words, layer selection transistors may collectively select at least one of the first wirings and the second wirings in the plane perpendicular to the layer surface of the unit memory layer. Such a structure is described below in the second example.

For the structure of the layer selection transistor, an SGT (Surrounding Gate Transistor), for example, may be used as a vertical transistor having a channel along a direction perpendicular to the major surface of the substrate. Here, "channel" refers to a path in which current flows in a semiconductor layer of the transistor. In this case, current flows in a direction perpendicular to the major surface of the substrate.

A vertical layer selection transistor provides an advantage of being able to perform connections to the layer selection transistor merely by forming contact plugs, even in the case where the number of laminations is increased. The layer selection transistor can be, for example, manufactured first on a semiconductor substrate, and then any number of memory layers can be manufactured thereupon. Then, each memory layer can be connected to the layer selection transistor merely by forming a contact plug; and a nonvolatile storage device of high storage density, having multiply laminated memory layers, can be relatively easily manufactured. It is unnecessary to increase the size in the direction parallel to the major surface of the substrate in order to accommodate the channel length when using a vertical transistor, and therefore the chip surface area can be reduced.

Alternatively for the structure of the layer selection transistor, a transistor having, for example, a channel along a direction parallel to the major surface of the substrate may be used. In such a case, the layer selection transistor may use, for example, an SOI (Silicon On Insulator) transistor that includes a silicon layer provided via an insulating layer on a semiconductor substrate. In such a case, current flows in the direction parallel to the major surface of the substrate.

Such a configuration provides an advantage that the layer selection transistor is not formed directly on the semiconductor substrate, and thereby the number of laminations can be increased without a major modification to the circuit on the semiconductor substrate.

Thus, the layer selection transistor can be provided more proximal to a substrate (for example, the semiconductor substrate) than is the component memory layer. Consequently, the step that connects the component memory layers and the layer selection transistors can be performed more easily, and design is also easier. Restated, a plurality of unit memory layers can be provided on a substrate, and a plurality of layer selection transistors can be provided between the plurality of unit memory layers and the substrate.

Layer selection transistors may, for example, include channels along directions perpendicular to a layer surface of a unit memory layer and collectively select at least one of the first wirings and the second wirings in a plane perpendicular or parallel to the layer surface.

Additionally, layer selection transistors may, for example, include channels along directions parallel to a layer surface of a unit memory layer, include silicon layers provided via insulating layers on a semiconductor substrate, and collectively select at least one of the first wirings and the second wirings in a plane perpendicular or parallel to a unit memory layer surface.

The present invention is not limited by the above descriptions; and the channel direction of the layer selection transistor may be any direction.

The first wirings of each unit memory layer may be commonly used by, for example, the second wirings of another unit memory layer. Also, the second wirings of each unit memory layer may be commonly used by, for example, the first wirings of another unit memory layer. In the case of the nonvolatile storage device 10, for example, the word lines are shared by the first unit memory layer and the second unit memory layer. Thus, each wiring of each unit memory layer may be shared as a wiring of another adjacent unit memory layer.

Restated, one of a plurality of first wirings and a plurality of second wirings of one of a plurality of unit memory layers may be shared as one of the plurality of first wirings and the plurality of second wirings of another unit memory layer adjacent to the one of the plurality of unit memory layers in a direction perpendicular to a layer surface of the one of the plurality of unit memory layers.

COMPARISON EXAMPLE

In a nonvolatile storage device of a comparison example, the nonvolatile storage device 10 is provided without the layer selection transistors TR1 to TR6. Otherwise, the configuration of the comparison example is the same as that of the nonvolatile storage device 10.

In the nonvolatile storage device of the comparison example, a memory cell is selected by selecting one desired word line from the three word lines WL1 to WL3, and by selecting one desired bit line from the six bit lines BL1 to BL6. That is, the word lines and the bit lines of each layer are independently drawn out to the peripheral circuit. Therefore, as the number of laminated memory layers increases, the number of bit lines drawn out also increases. The bit lines and the word lines that configure the memory cells normally are formed having the minimum fabrication width (minimum half pitch: =F). Hence, as the number of laminations increases, the draw-out of the laminated bit lines from the cell region and the connections to the peripheral circuit become complex, and the burden of design becomes worse.

Conversely, layer selection transistors are provided in the nonvolatile storage device 10 according to this embodiment, and thereby the number of bit lines ultimately drawn out does not increase even as the number of laminated memory layers increases. In other words, layer selection transistors combine bit lines of each memory layer, and therefore the number of bit lines ultimately drawn out does not vary. Consequently, the number of laminated memory layers can be increased without drastically modifying the peripheral circuit.

That is, bit lines or word lines that are drawn out to the peripheral circuit can be collected through layer selection transistors. Therefore, wirings can be drawn out in regular arrangements without complexity.

Thus, the nonvolatile storage device 10 according to this embodiment enables a large storage capacity without a complex draw-out from the memory layers, even in the case where the number of laminated memory layers is increased.

FIRST EXAMPLE

A first example according to this embodiment will now be described.

A nonvolatile storage device 11 according to the first example is an example in which SGT transistors that collectively select bit lines in a plane parallel to a major surface of a substrate is used as the layer selection transistors. The SGT transistor is a vertical transistor including a channel along a direction perpendicular to the major surface of the substrate. A gate electrode is provided opposite to a face of the channel that lies along a direction perpendicular to the major surface of the substrate and is provided to surround the channel. In this structure, the gate electrode of the SGT transistor essentially surrounds the channel completely. Hence, the dominance of the gate is strong, and the cut-off characteristics are excellent. This structure is therefore suitable as the layer selection transistor. Additionally, in the case where an SGT transistor is used, the layer selection transistors can be disposed along a plane regardless of the number of laminated memory layers, providing an advantage that a drastic modification of the shape of drawn-out wirings is unnecessary even in the case where the number of laminations is increased.

Figure 3:
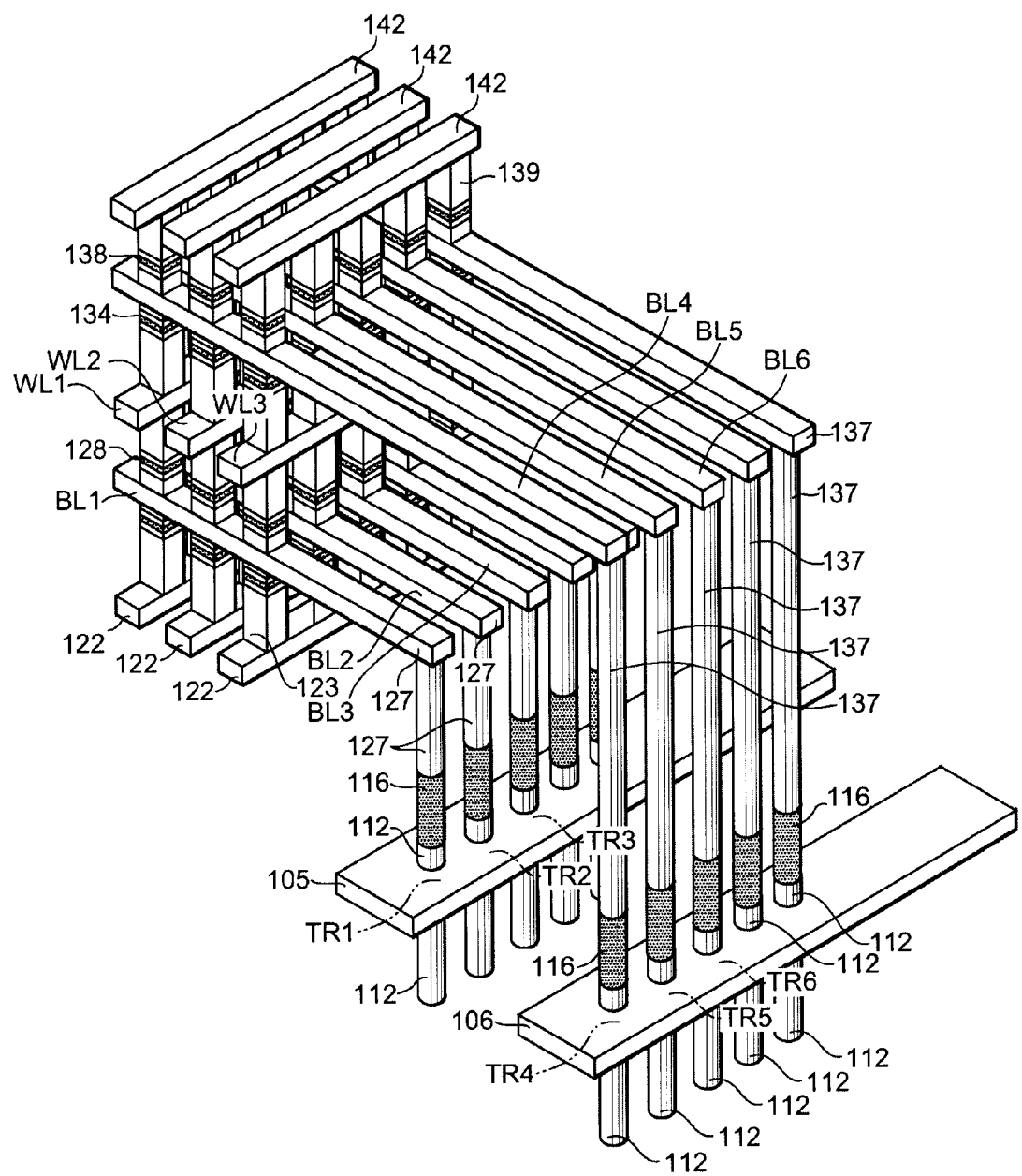
FIG. 3 is a schematic perspective view illustrating the configuration of a nonvolatile storage device according to a first example of the invention

FIG. 3 is a schematic perspective view illustrating the configuration of the nonvolatile storage device according to the first example of the present invention.

Only four laminated memory layers are illustrated in FIG. 3 to avoid complexity. The illustration of insulating films and the like between layers is also omitted for the same purpose.

In the nonvolatile storage device according to this example illustrated in FIG. 3, a conductive film 122 that forms word lines, a film 127 of, for example, tungsten, that forms bit lines, a conductive film 132 that forms word lines, a film 137 of, for example, tungsten, that forms bit lines, and a conductive film 142 that forms word lines, are provided to intersect. Resistance change elements 124, 128, 134, and 138 that form recording layers are provided in the four layers respectively therebetween.

Layer selection transistors TR1 to TR6 are provided to select a series of bit lines (tungsten films 127 and 137) of the two layers.

The layer selection transistors TR1 to TR6 are SGT transistors in which gate electrodes 105 and 106 surround channel silicon plugs 112.

Bit lines in the same plane parallel to the major surface of the substrate can be collectively selected per floor by the layer selection transistors TR1 to TR6. The operations described in FIG. 1 are possible.

The nonvolatile storage device 11 and a method for manufacturing the same of this example will now be described. The nonvolatile storage device 11 of this example has eight laminated memory layers.

FIGS. 4A to 4D show cross-sectional views in order of the steps, illustrating a method for manufacturing the nonvolatile storage device according to the first example of the present invention.

Figure 4A:
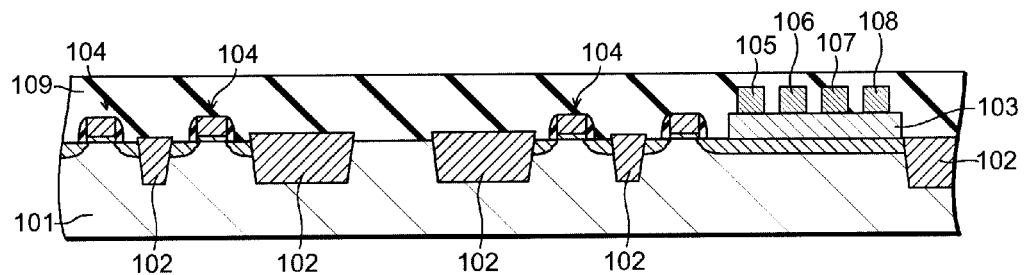
FIGS. 4A to 4D show cross-sectional views in order of the steps, illustrating a method for manufacturing the nonvolatile storage device according to the first example of the invention.
Figure 4B:
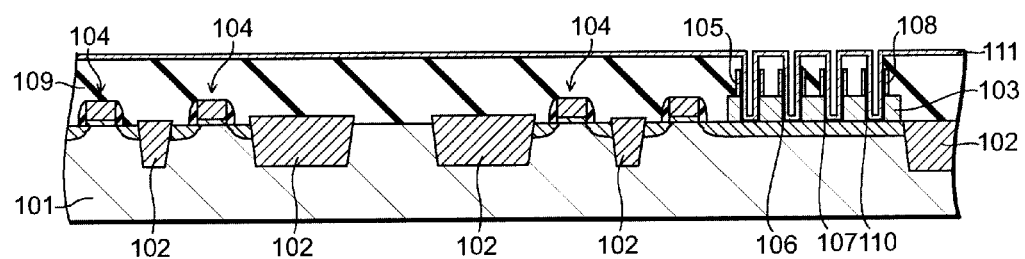
Figure 4C:
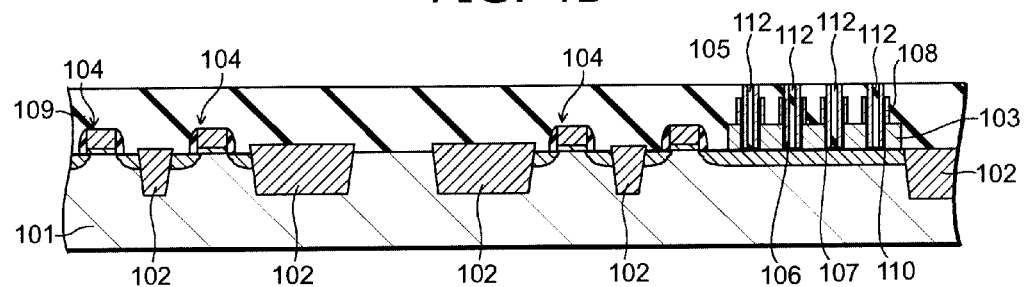
Figure 4D:
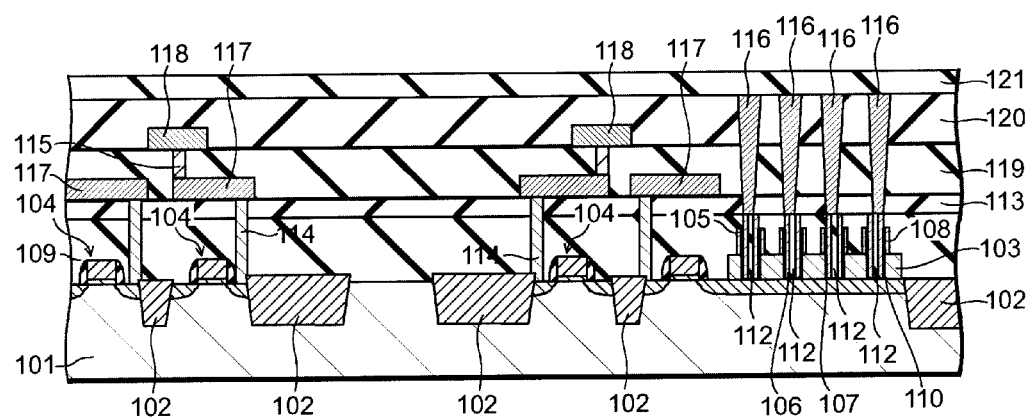
Figure 5A:
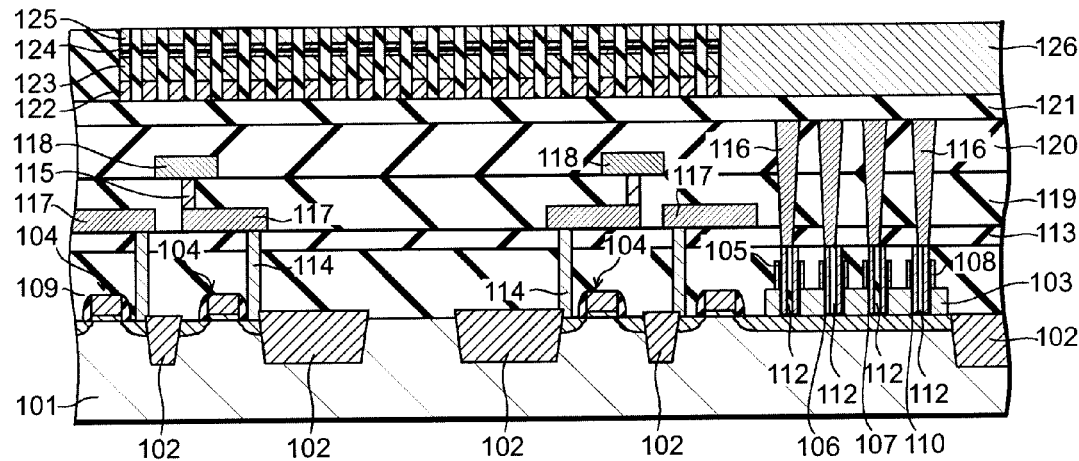
FIGS. 5A and 5B show cross-sectional views in order of the steps, continuing from FIG. 4D.
Figure 5B:
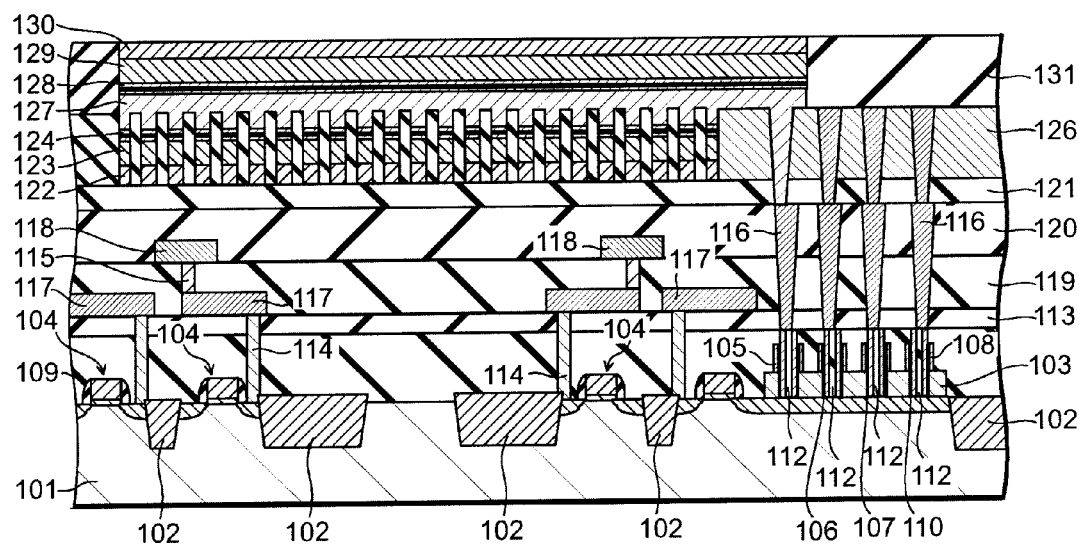
Figure 6A:
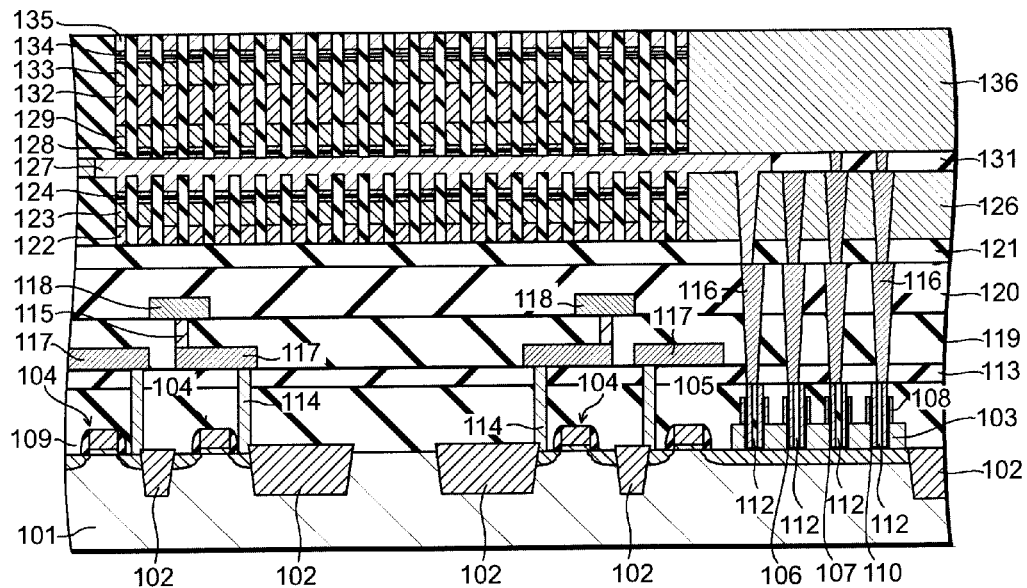
FIGS. 6A and 6B show cross-sectional views in order of the steps, continuing from FIG. 5B.
Figure 6B:
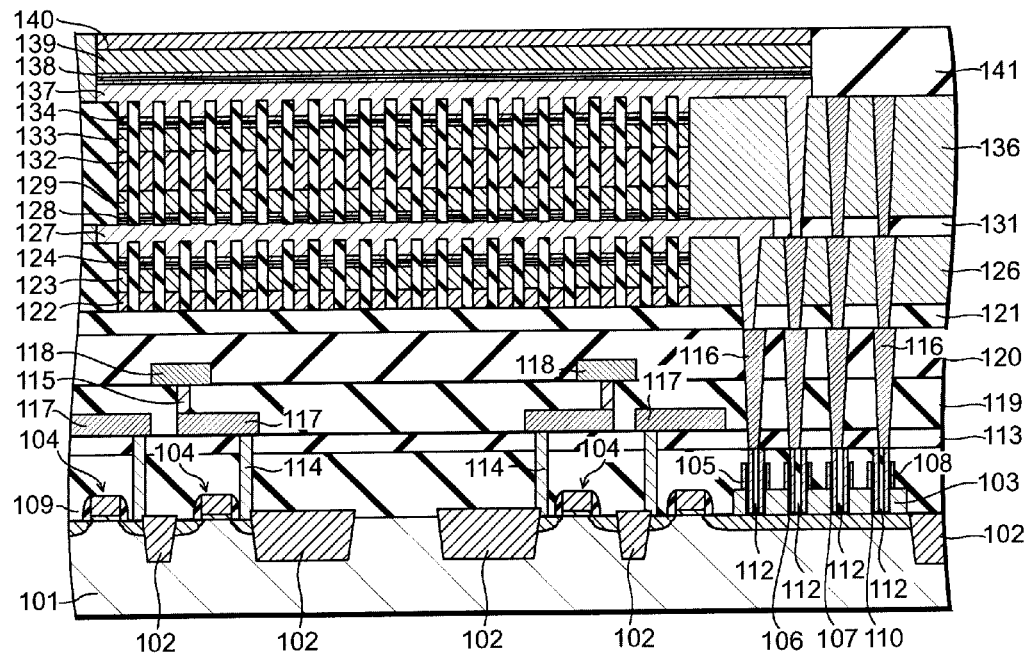
Figure 7:
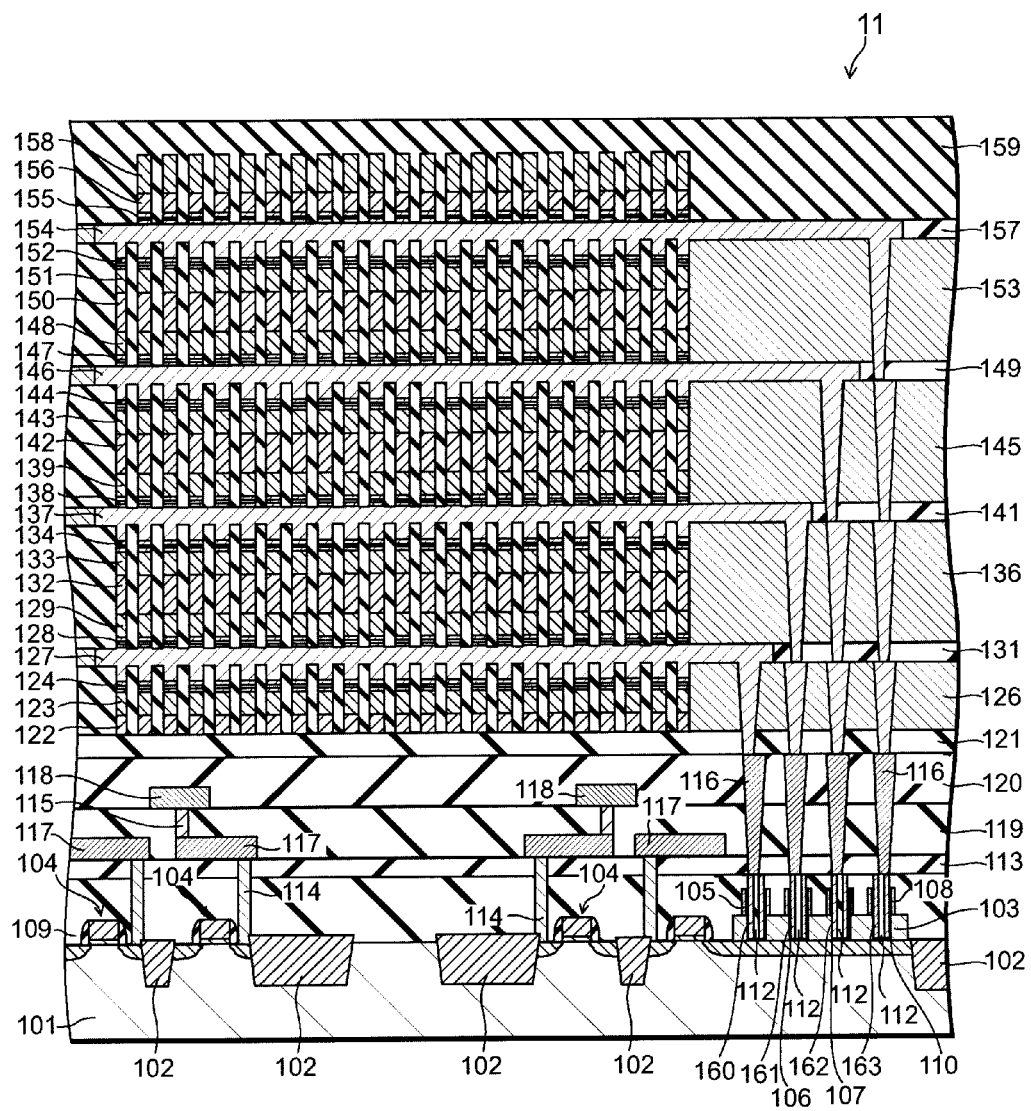
FIG. 7 shows a cross-sectional view in order of the steps, continuing from FIG. 6B.

FIGS. 5A and 5B show cross-sectional views in order of the steps, continuing from FIG. 4D. FIGS. 6A and 6B show cross-sectional views in order of the steps, continuing from FIG. 5B. FIG. 7 shows cross-sectional views in order of the steps, continuing from FIG. 6B.

Figure 8:
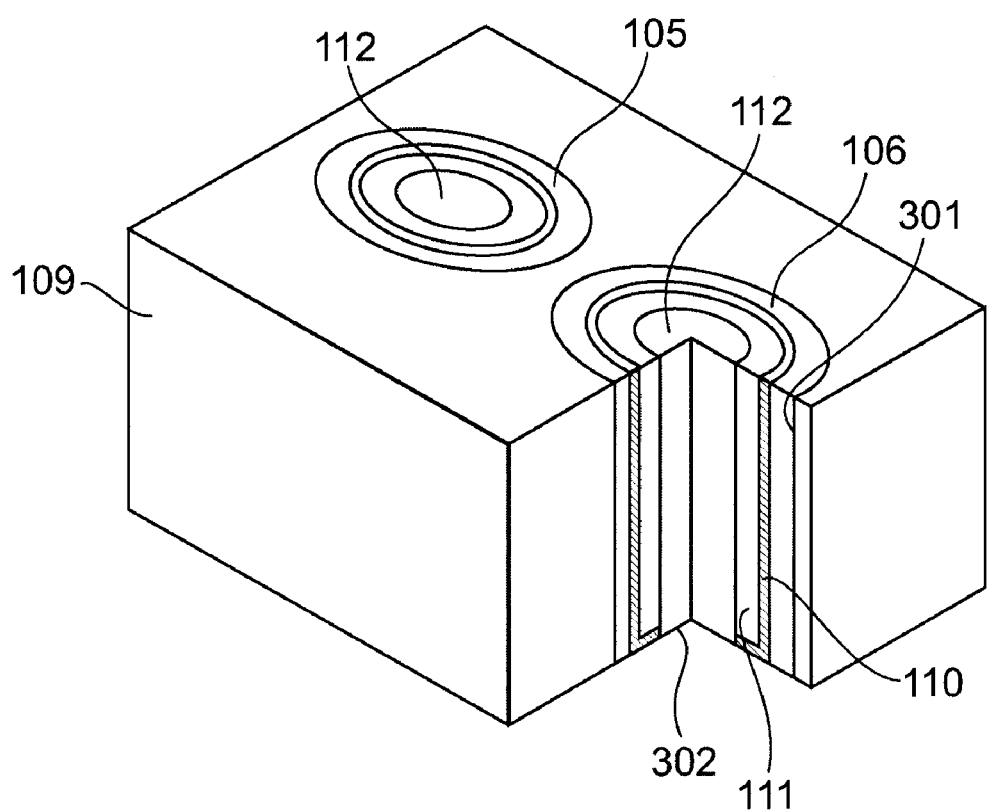
FIG. 8 is a schematic perspective view illustrating the structure of the layer selection transistor of the nonvolatile storage device according to the first example of the invention.

FIG. 8 is a schematic perspective view illustrating the structure of the layer selection transistor of the nonvolatile storage device according to the first example of the present invention.

To afford better understanding of the connections from the bit lines to the layer selection transistors, FIG. 4A to FIG. 7 illustrate cross-sectional views in the word line direction (cross-sectional views cut by a plane perpendicular to the extension direction of the word lines), namely for example, the cross-sectional view along line A-A' in FIG. 2.

First, as illustrated in FIG. 4A, STIs (Shallow Trench Isolation) 102 are formed above a semiconductor substrate 101. An inter-layer insulating film 103 is formed in a region where the layer selection transistors of this example are formed subsequently.

Then, transistors 104 are provided to form the peripheral circuit of the laminated structure (resistance change memory portion). Here, a polysilicon film that forms the gate electrodes of the transistors 104 is also used as the electrodes of the layer selection transistors. When the gate electrodes of the transistors 104 are fashioned, the shapes of the gate electrodes of the layer selection transistors are simultaneously fashioned on the inter-layer insulating film 103 by lithography and reactive ion etching.

Gate electrodes 105, 106, 107, and 108 of the layer selection transistors are formed. An inter-layer insulating film 109 is formed over the entire surface of the substrate 101, and its surface is flattened. The four gate electrodes 105, 106, 107, and 108 of the layer selection transistors are formed to correspond to the four laminated layers of this example.

Continuing as illustrated in FIG. 4B, contact holes are made to pass completely through the gate electrodes 105, 106, 107, and 108 of the layer selection transistors by lithography and reactive ion etching. A gate oxidation film 110 and an amorphous silicon film 111 are formed as liners inside the contact holes by CVD (Chemical Vapor Deposition).

Then as illustrated in FIG. 4C, reactive ion etching is used to remove the amorphous silicon film 111 and the gate oxidation film 110 from the bottoms of the contact holes. CVD is then used to fill the contact holes with a phosphorus-doped amorphous silicon film, followed by activation annealing to crystallize. The steps for this portion are complex, and therefore the layer selection transistor portion in particular is enlarged separately in FIG. 8.

As illustrated in FIG. 8, the amorphous silicon film 111 and the gate oxidation film 110 are removed from the bottoms 302 of the contact holes 301. A phosphorus-doped amorphous silicon film is filled into the contact holes 301 to form channel silicon plugs 112.

Thus, as illustrated in FIG. 4C, the channel silicon plugs 112 are formed for vertical transistors, i.e., the layer selection transistors.

Continuing as illustrated in FIG. 4D, an inter-layer insulating film 113 is formed over the entire substrate surface. Contact plugs 114, 115, and 116; M0 wirings (source wirings) 117; M1 wirings (bit lines) 118; and inter-layer insulating films 119, 120, and 121 are formed by known semiconductor manufacturing technology.

Then as illustrated in FIG. 5A, a conductive film 122 that forms word lines of a first memory layer, diodes 123, resistance change elements (recording layers) 124, and a silicon nitride film 125 forming a CMP (Chemical Mechanical Polishing) stopper are formed and then fashioned by lithography and reactive ion etching. An inter-layer insulating film 126 is filled between the word lines, and CMP is used to flatten the surface thereof.

Continuing as illustrated in FIG. 5B, the silicon nitride film 125 is removed by selective etching, after which contact holes are made by lithography and reactive ion etching to communicate with the channel silicon plugs 112 of vertical transistors, i.e., the layer selection transistors. A conductive film 127 that forms the first layer bit lines is filled into the contact holes and the openings made by the removal of the silicon nitride film 125 by selective etching, and is formed over the entire substrate surface. Resistance change elements 128, diodes 129, and the CMP stopper formed by a silicon nitride film 130, are formed by lamination. This laminated film is then collectively fashioned by lithography and reactive ion etching. An inter-layer insulating film 131 is filled between the laminated films that were collectively fashioned. The configuration is then flattened by CMP technology.

Then as illustrated in FIG. 6A, the silicon nitride film 130 is removed by selective etching, after which a conductive film 132 that forms second layer word lines, diodes 133, resistance change elements 134, and a silicon nitride film 135 forming a CMP stopper are formed and then fashioned by lithography and reactive ion etching. An inter-layer insulating film 136 is filled between the word lines, and CMP is used to flatten the surface.

Continuing as illustrated in FIG. 6B, the silicon nitride film 135 is removed by selective etching, after which contact holes are made by lithography and reactive ion etching to communicate with the channel silicon plugs 112 of vertical transistors, i.e., the layer selection transistors. A conductive film 137 that forms second layer bit lines is filled into the contact holes and the openings made by the removal of the silicon nitride film 135 by selective etching, and is formed over the entire substrate surface. Resistance change elements 138, diodes 139, and the CMP stopper formed by a silicon nitride film 140 are formed by lamination. This laminated film is then collectively fashioned by lithography and reactive ion etching. An inter-layer insulating film 141 is filled between the laminated films that were collectively fashioned. The configuration is then flattened by CMP technology.

As illustrated in FIG. 7, similar steps as those recited above are then repeated to laminate conductive films 146 and 154 that form bit lines, conductive films 142, 150, and 158 that form word lines, diodes 143, 148, 151, and 156, resistance change elements 144, 147, 152, and 155, and inter-layer insulating films 145, 149, 153, 157, and 159, thus constructing a structure having eight laminated layers of memory cells.

Circuitry layers, etc., of the upper layer are then formed. However, details thereof are omitted.

Thus, the nonvolatile storage device 11 illustrated in FIG. 7 is completed. Now referring to the illustration of FIG. 7 from the lower layer upward, the first layer bit lines (conductive film 127) are connected to layer selection transistors 160 via contact plugs; the second layer bit lines (conductive film 137) are likewise connected to layer selection transistors 161; the third layer bit lines (conductive film 146) are likewise connected to layer selection transistors 162; and the fourth layer bit lines (conductive film 154) are likewise connected to layer selection transistors 163.

In the nonvolatile storage device 11 according to this example as illustrated in FIG. 7, even in the case where the number of laminated memory layers is increased, merely the addition of layer selection transistors is required; and a major modification to the circuit structure and the draw-out of wirings is unnecessary.

Although a detailed description of the resistance change material and the like that form a Metal-Insulator-Metal (MIM) laminated film is omitted in this example, the insulator layer recited above (resistance change layer, recording layer) may include, for example, any substance wherein a voltage applied to both ends causes the resistance state to change, such as at least one selected from the group consisting of C, $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$; and may include any substance wherein Joule heat generated by a voltage applied to both ends causes the resistance state to change, such as at least one selected from the group consisting of chalcogenide GST ($Ge_xSb_yTe_z$), N-doped GST and O-doped GST in which a dopant is added to a GST, $Ge_xSb_y$, and $In_xGe_yTe_z$. Additionally, a material may be included having two or more of such materials mixed. Furthermore, a structure of multiply laminated layers of such materials may be used.

The electrode material of the first and second wiring may include a material that does not react with the resistance change material recited above and compromise the resistance change properties, such as for example, a material including at least one selected from the group consisting of tungsten nitride, titanium nitride, titanium aluminum nitride, tantalum nitride, titanium silicide nitride, tantalum carbide, titanium silicide, tungsten silicide, cobalt silicide, nickel silicide, nickel platinum silicide, platinum, ruthenium, platinum-rhodium, and iridium.

The material used as the rectifying element (diode) provided between the recording layer and at least one of the first wiring and the second wiring may include a semiconductor such as silicon, germanium, and the like; and may include a metal oxide semiconductor such as NiO, TiO, CuO, InZnO, and the like.

Thus, the nonvolatile storage device 11 of this example enables a relatively easy increase of the number of laminations of a laminated, highly integrated resistance change memory. Therefore, it is possible to provide a resistance change memory of even higher integration.

The nonvolatile storage device 11 of this example is formed using a step that forms layer selection transistors on a semiconductor substrate and then forms a laminated resistance change memory cell array, and a step that connects each of the laminated memory cells to a layer selection transistor. Thereby, the layer selection transistors are formed in advance regardless of the number of memory layers to be laminated. Consequently, it is possible to make uniform the characteristics of the layer selection transistors of each layer; and effects of the thermal budget of the transistor formation step on the memory cells can be inhibited.

The layer selection transistor of the nonvolatile storage device 11 of this example is formed by a method for manufacturing a resistance change memory including a step that forms a conductive film that forms gate electrodes; a step that makes holes to pass completely through the conductive film and communicate to the substrate; a step that forms a gate insulating film inside the holes; and a step that forms a semiconductor film that forms transistor channels. The layer selection transistor is a vertical transistor which has a channel along a direction perpendicular to a major surface of the substrate, prevents short channel effects, and provides excellent cut-off characteristics and stable performance.

By using a vertical transistor structure in which the channel is perpendicular to the major surface of the substrate, for example, the contact plug can be connected easily to the channel formed in the silicon substrate; and the wirings (first wiring and second wiring) of the laminated memory layers can be connected easily to the contact plug.

Thus, the nonvolatile storage device 11 and the method for manufacturing the same according to this example enable a large storage capacity without a complex draw-out from the memory layers, even in the case where the number of laminated memory layers is increased.

Second Embodiment

Figure 9:
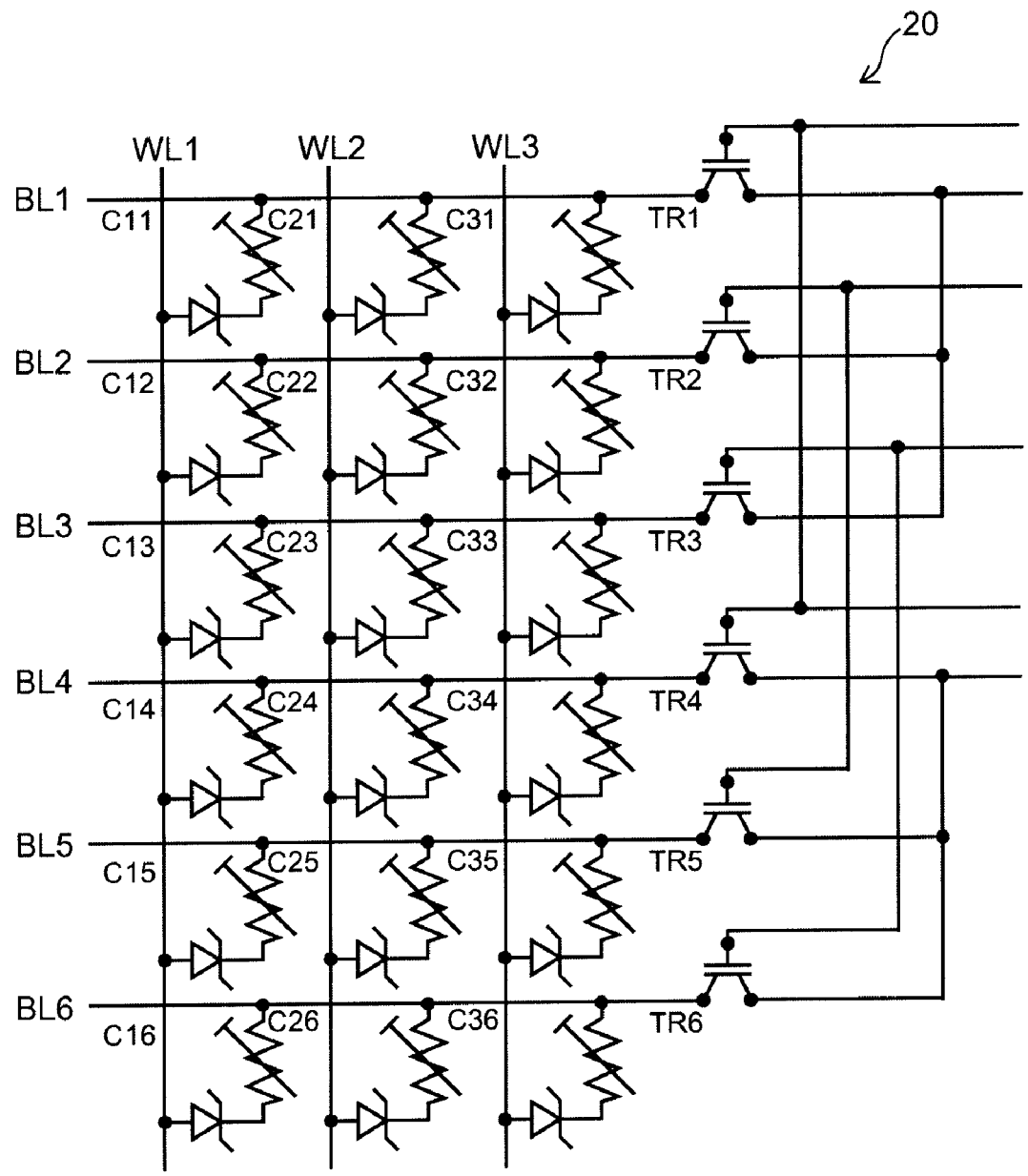
FIG. 9 is a circuit configuration diagram illustrating a structure of a nonvolatile storage device according to a second embodiment of the invention.

FIG. 9 is a circuit configuration diagram illustrating a structure of a nonvolatile storage device according to a second embodiment of the present invention.

As illustrated in FIG. 9, a nonvolatile storage device 20 according to the second embodiment of the present invention uses layer selection transistors that select a series of bit lines laminated in two layers.

Namely, layer selection transistors TR1, TR2, and TR3 are provided to select the recording layers of the first layer; layer selection transistors TR4, TR5, and TR6 are provided to select the recording layers of the second layer; and the laminated recording layers are selected by the layer selection transistors TR1 to TR6.

The gate electrodes of the layer selection transistor TR1 that selects the first memory layer and the layer selection transistor TR4 that selects the second memory layer have a common potential. Likewise, the gate electrodes of the layer selection transistors TR2 and TR5 have a common potential, and the gate electrodes of the layer selection transistors TR3 and TR6 have a common potential. Restated, the layer selection transistors can select a series of the bit lines of the first layer and the second layer.

Accordingly, common bit lines can be used to draw out from the bit lines BL1 to BL3 and BL4 to BL6. Then, when reading or writing the bit lines BL1 and BL4 of the first series, the layer selection transistors TR1 and TR4 are selected; when reading or writing the bit lines BL2 and BL5 of the second series, the layer selection transistors TR2 and TR5 are selected; and when reading or writing the bit lines BL3 and BL6 of the third series, the layer selection transistors TR3 and TR6 are selected. Hence, it is possible to read or write any cell of any layer.

Thus, layer selection transistors can collectively select at least one of the first wirings and the second wirings in a plane perpendicular to the layer surface of the unit memory layer.

In this specific example, a gate electrode of one of a plurality of layer selection transistors that select recording layers of one of a plurality of unit memory layers is electrically connected to a gate electrode of another of the plurality of layer selection transistors that select recording layers of another of the plurality of unit memory layers.

Here, a plurality of first wirings in the same unit memory layer from the plurality of unit memory layers are connected to the same wiring; or, a plurality of second wirings in the same unit memory layer from the plurality of unit memory layers are connected to the same wiring.

Thus, bit lines in the same plane perpendicular to the major surface of the substrate of the nonvolatile storage device 20 can be collectively drawn out, enabling a drastic size reduction of the peripheral circuit. FIG. 9 illustrates two laminated layers; but the number of laminations is arbitrary.

Such a configuration of the nonvolatile storage device 20 also enables a large storage capacity without a complex drawout from the memory layers, even in the case where the number of laminated memory layers is increased.

SECOND EXAMPLE

Figure 10:
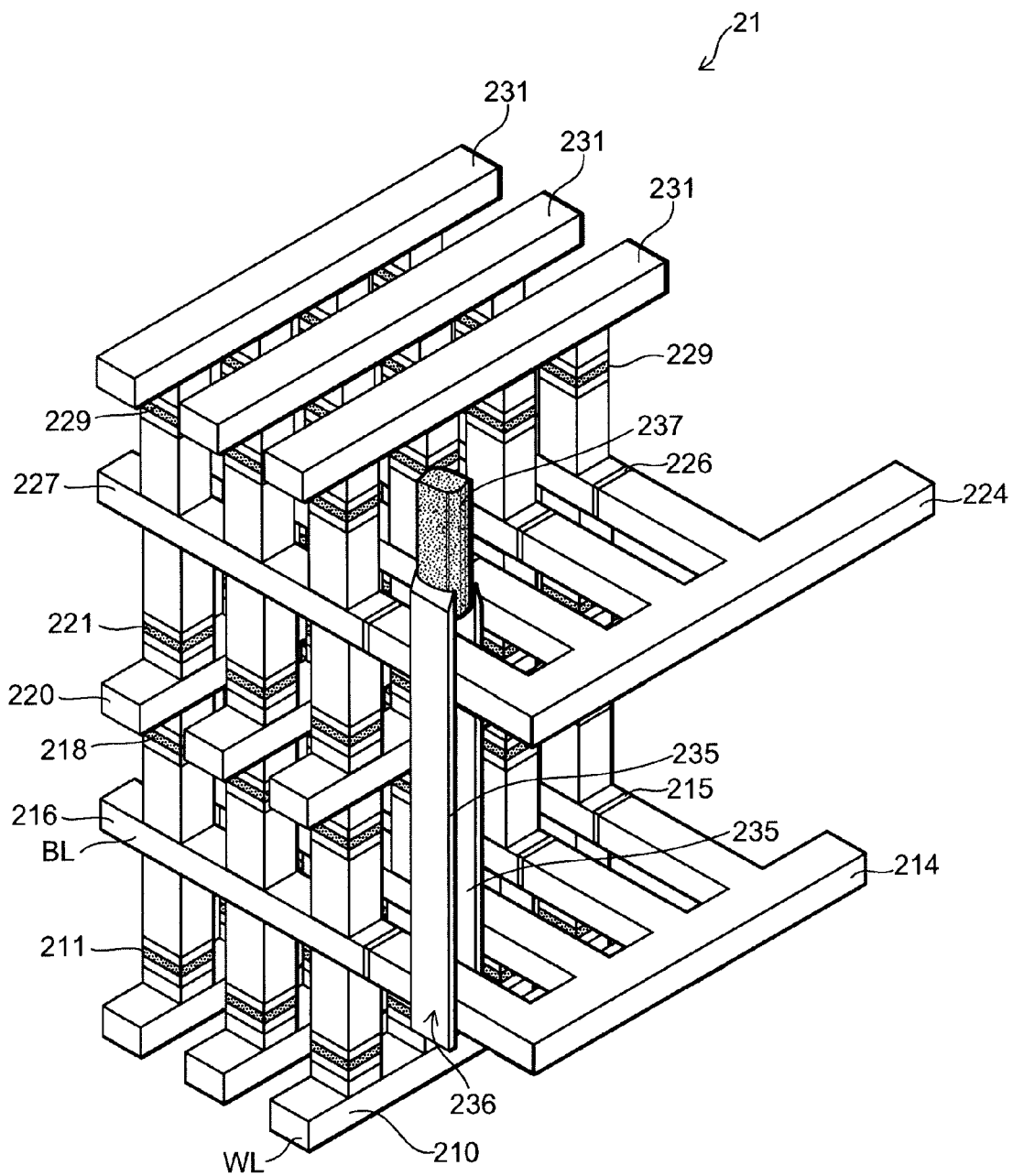
FIG. 10 is a schematic perspective view illustrating a structure of a nonvolatile storage device according to a second example of the invention.

FIG. 10 is a schematic perspective view illustrating a structure of a nonvolatile storage device according to a second example of the present invention.

Four laminated memory layers of a nonvolatile storage device 21 of the second example according to the second embodiment are illustrated in FIG. 10. Namely, a conductive film 210 that forms word lines, a film 216 of, for example, tungsten, that forms bit lines, a conductive film 220 that forms word lines, a film 227 of, for example, tungsten, that forms bit lines, and a conductive film 231 that forms word lines, are provided to intersect. Resistance change elements 211, 218, 221, and 229 that form recording layers are provided in four layers respectively therebetween.

Layer selection transistors 236 are provided to select a series of bit lines (the tungsten films 216 and 227) of the two layers. To illustrate all of the layer selection transistors would make the drawing complex, and so layer selection transistors for only one bit line in the foreground of the drawing, i.e., the layer selection transistors 236, is illustrated. However, layer selection transistors are arranged along a line from the layer selection transistors 236; and each selects a series of bit lines (the tungsten films 216 and 227) of two layers. An illustration of insulating films and the like between layers also is omitted for the same reasons recited above.

In the example of the nonvolatile storage device 21, gate electrodes 235 of the layer selection transistors 236 are provided on portions of phosphorus-doped polycrystalline silicon films 214 and 224 which are connected to the bit lines (the tungsten films 216 and 227, respectively) of two layers.

The lower layer bit line (tungsten film 216) and the upper layer bit line (tungsten film 227) are in the same plane perpendicular to the major surface of the substrate and can be collectively selected by the layer selection transistors, enabling the operations described in FIG. 9.

A contact plug 237 illustrated in FIG. 10 connects the gate electrodes 235 to the peripheral circuit.

The layer selection transistor of the nonvolatile storage device 21 according to this example includes a channel extending in a direction parallel to the major surface of the semiconductor substrate (the direction parallel to the layer surface of the unit memory layer). The layer selection transistor has an SOI structure including a silicon layer provided via an insulating layer on the semiconductor substrate. The layer selection transistors can collectively select bit lines in a plane perpendicular to the major surface of the semiconductor substrate (perpendicular to the layer surface of the unit memory layer).

A method for manufacturing the nonvolatile storage device 21 of this example will now be described.

Figures 11A, 11B, 11C:
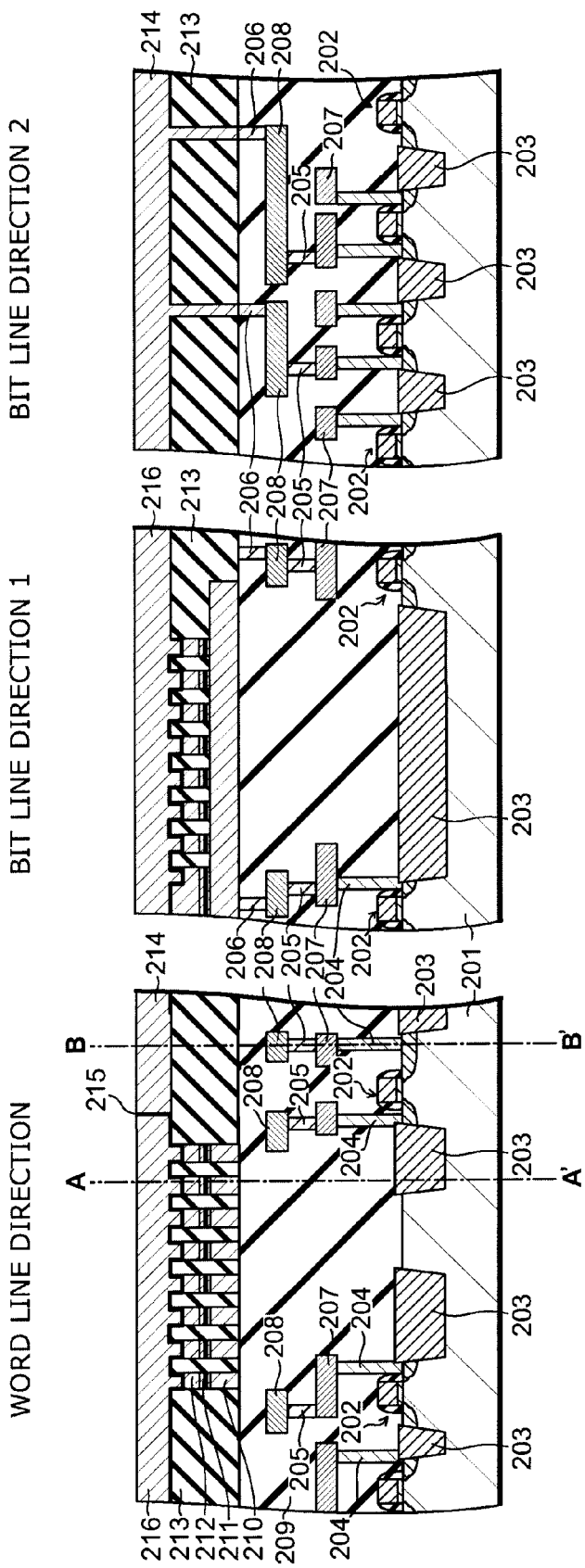
FIGS. 11A to 11C are cross-sectional views in order of the steps, illustrating a method for manufacturing the nonvolatile storage device according to the second example of the invention.

FIGS. 11A to 11C are cross-sectional views in order of the steps, illustrating the method for manufacturing the nonvolatile storage device according to the second example of the present invention. FIG. 11A is a cross-sectional view in the word line direction (a view cut by a plane perpendicular to the extension direction of the word lines). FIG. 11B and FIG. 11C are cross-sectional views in the bit line direction (views cut by a plane perpendicular to the extension direction of the bit lines) and are the cross-sectional views along lines A-A' and B-B' of FIG. 11A, respectively.

Figures 12A, 12B, 12C:
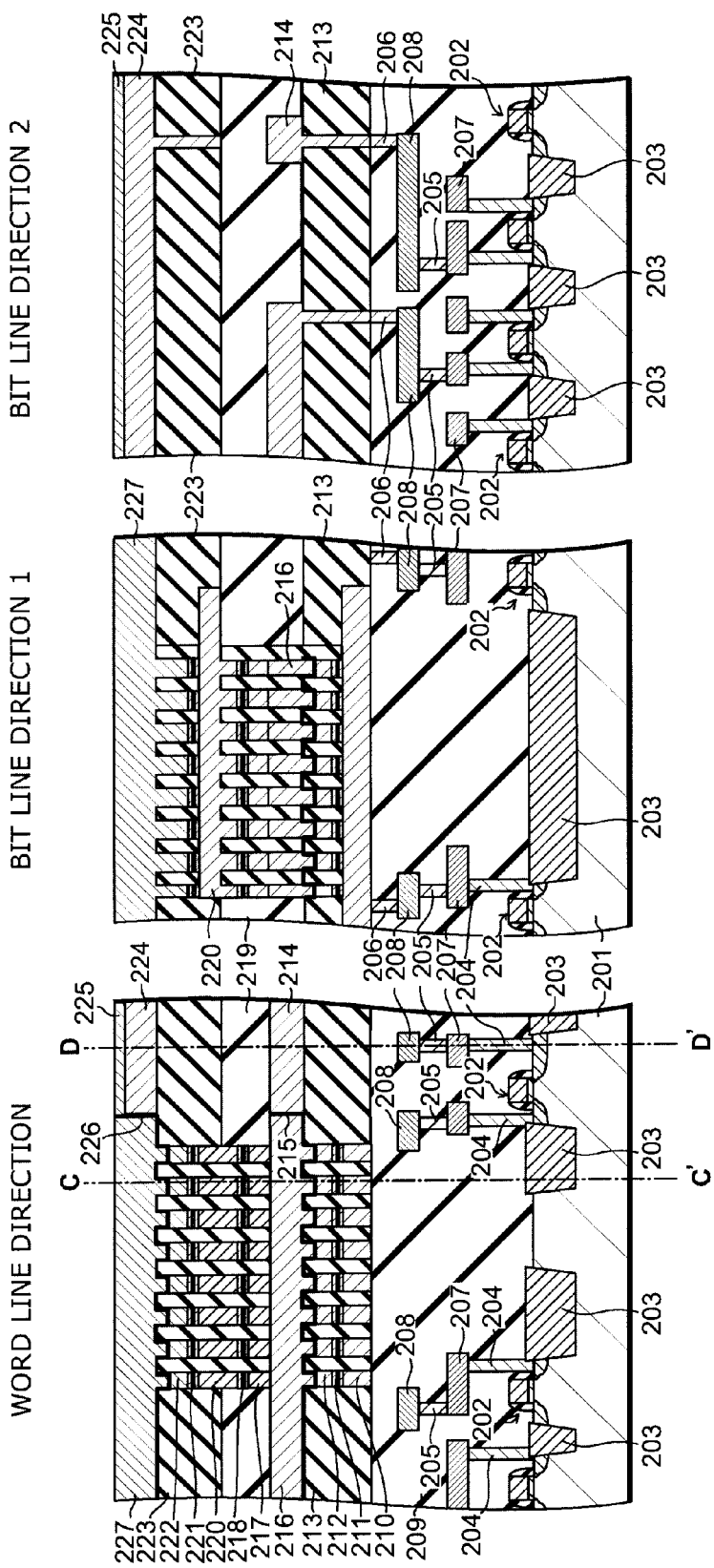
FIGS. 12A to 12C are cross-sectional views in order of the steps, continuing from FIG. 11C.

FIGS. 12A to 12C are cross-sectional views in order of the steps, continuing from FIG. 11C. FIG. 12A is a cross-sectional view in the word line direction. FIG. 12B and FIG. 12C are cross-sectional views along lines C-C' and D-D' of FIG. 12A, respectively.

Figures 13A, 13B, 13C:
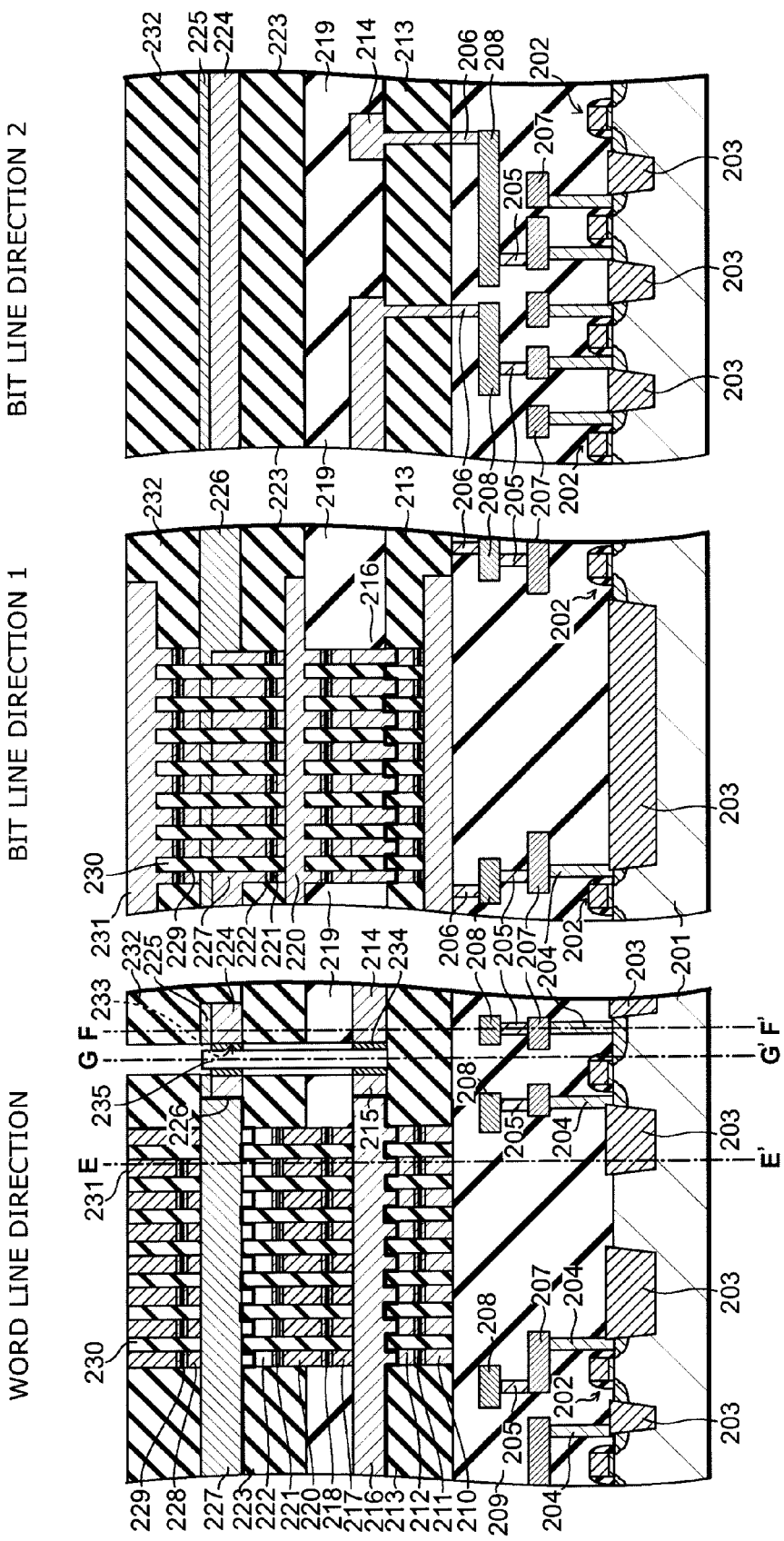
FIGS. 13A to 13C are cross-sectional views in order of the steps, continuing from FIG. 12C.

FIGS. 13A to 13C are cross-sectional views in order of the steps, continuing from FIG. 12C. FIG. 13A is a cross-sectional view in the word line direction. FIG. 13B and FIG. 13C are cross-sectional views along lines E-E' and F-F' of FIG. 13A, respectively.

Figure 14:
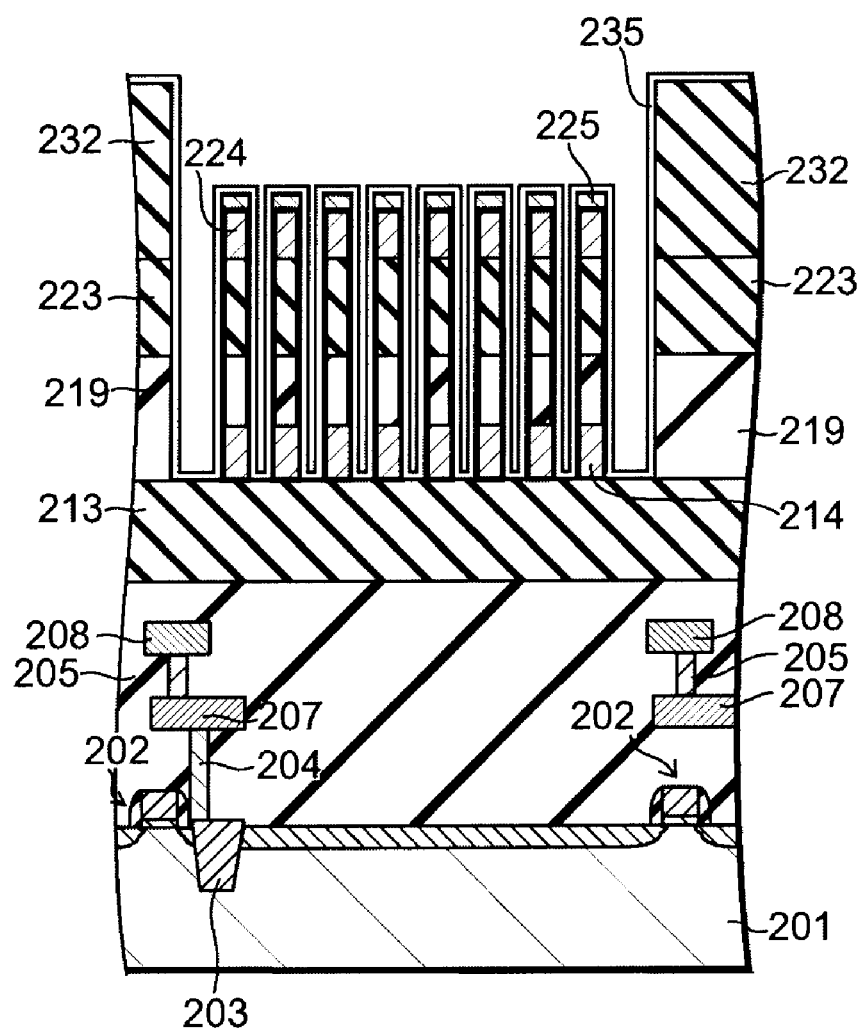
FIG. 14 is a cross-sectional view along line G-G' of FIG. 13A.

FIG. 14 is a cross-sectional view along line G-G' of FIG. 13A.

First, as illustrated in FIGS. 11A to 11C, a peripheral circuit for the laminated structure (resistance change memory portion) is formed by known semiconductor manufacturing technology on a semiconductor substrate 201. The peripheral circuit includes transistors 202, STIs 203, contact plugs 204, 205, and 206, M0 wirings 207, and M1 wirings 208. In the nonvolatile storage device 21 of this example, the word lines are drawn out to the left and right, and therefore the contact plugs 204 to 206 that connect to the word lines are formed in advance.

An inter-layer insulating film 209 covers the entire surface, and the surface of the inter-layer insulating film 209 is flattened. By steps similar to those of the first example, a conductive film 210 that forms word lines, resistance change elements 211, diodes 212, and a CMP stopper are laminated. These laminated films are collectively fashioned. Then, an inter-layer insulating film 213 is filled between the word lines, the configuration is flattened by CMP, and the CMP stopper is removed. Contact holes are made for connecting the layer selection transistors to the peripheral circuit.

Continuing, a phosphorus-doped polycrystalline silicon film 214 is formed over the entire substrate surface and filled into the contact holes. Lithography and reactive ion etching are used to remove the phosphorus-doped polycrystalline silicon film 214 from a storage cell region. A tungsten film 216 is formed via a barrier metal 215, and the surface of the configuration is flattened.

Thus, a structure is formed in which the tungsten film 216 and the phosphorus-doped polycrystalline silicon film 214 connect via the barrier metal 215 along a horizontal direction forming bit lines.

Then as illustrated in FIGS. 12A to 12C, diodes 217, resistance change elements 218, and a CMP stopper are laminated on the entire substrate surface and then collectively fashioned. An inter-layer insulating film 219 is filled between the bit lines, the surface of the inter-layer insulating film 219 is flattened by CMP, and the CMP stopper is removed. A conductive film 220 that forms second layer word lines, resistance change elements 221, diodes 222, and a CMP stopper are laminated. The configuration is collectively fashioned, and an inter-layer insulating film 223 is filled between the word lines. After flattening the surface of the configuration by CMP, the CMP stopper is removed.

Contact holes are made for connecting the layer selection transistors to the peripheral circuit. A phosphorus-doped polycrystalline silicon film 224 is formed over the entire substrate surface and filled into the contact holes.

A silicon nitride film 225 is formed over the entire substrate surface.

Continuing, lithography and reactive ion etching are used to remove the silicon nitride film 225 and the phosphorus-doped polycrystalline silicon film 224 from the cell region. A tungsten film 227 is formed via a barrier metal 226, and the surface of the configuration is flattened.

Thus, a structure is formed in which the tungsten film 227 and the phosphorus-doped polycrystalline silicon film 224 connect via the barrier metal 226 along the horizontal direction forming second layer bit lines.

Then as illustrated in FIGS. 13A to 13C and FIG. 14, diodes 228, resistance change elements 229, and a CMP stopper are laminated over the entire substrate surface and collectively fashioned. An inter-layer insulating film 230 is filled between the bit lines, the surface of the configuration is flattened by CMP, and the CMP stopper is removed. A conductive film 231 that forms second layer word lines is formed and collectively fashioned. An inter-layer insulating film 232 is filled between the word lines, and the surface of the configuration is flattened by CMP.

Continuing to form gates of the layer selection transistors, openings 233 are made in the inter-layer insulating films 219, 223, and 232 by partial etching, and sides of the Phosphorus-doped polycrystalline silicon films 214 and 224 are exposed.

Then, the sides of the phosphorus-doped polycrystalline silicon films 214 and 224 are oxidized to form a gate oxidation film 234 and a conductive film 235 that forms the gate electrodes.

Thus, layer selection transistors can be formed having gate electrodes formed by the conductive film 235. The layer selection transistors can collectively select a lower layer bit line (tungsten film 216) and an upper layer bit line (tungsten film 227) in the same plane perpendicular to the major surface of the substrate.

The nonvolatile storage device 21 illustrated in FIG. 10 is then completed by fashioning the conductive film 235, forming layer selection transistors by connecting each laminated bit line to the peripheral circuit, and forming a circuitry layer on the upper layer. The details thereof are omitted.

The steps that form the layer selection transistors of the nonvolatile storage device 21 of this example are complex in comparison to those of the first example. However, bit lines in the same plane perpendicular to the major surface of the substrate can be collectively drawn out, and therefore a drastic size reduction of the peripheral circuit is possible.

Although a detailed description of the resistance change material and the like that form the resistance change element of the nonvolatile storage device 21 of this example is omitted, the insulator layer recited above may include, for example, any substance wherein a voltage applied to both ends causes the resistance state to change, such as at least one selected from the group consisting of C, $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$; and may include any substance wherein Joule heat generated by a voltage applied to both ends causes the resistance state to change, such as at least one selected from the group consisting of chalcogenide GST, N-doped GST and O-doped GST in which a dopant is added to a GST, $Ge_xSb_y$, and $In_xGe_yTe_z$. Additionally, a material may be included having two or more of such materials mixed. Furthermore, a structure of multiply laminated layers of such materials may be used.

The electrode material of the first and second wiring may include a material that does not react with the resistance change material recited above and compromise the resistance change properties such as, for example, a material including at least one selected from the group consisting of tungsten nitride, titanium nitride, titanium aluminum nitride, tantalum nitride, titanium silicide nitride, tantalum carbide, titanium silicide, tungsten silicide, cobalt silicide, nickel silicide, nickel platinum silicide, platinum, ruthenium, platinum-rhodium, and iridium.

The material used as the rectifying element (diode) may include a semiconductor such as silicon, germanium, and the like; and may include a metal oxide semiconductor such as NiO, TiO, CuO, InZnO, and the like.

Thus, the nonvolatile storage device 21 of this example enables a relatively easy increase of the number of laminations of a laminated, highly integrated resistance change memory. Therefore, it is possible to provide a resistance change memory of even higher integration.

A vertical layer selection transistor enables a connection to the layer selection transistor by merely forming a contact plug, even in the case where the number of laminations is increased.

Furthermore, an SOI structure provides a layer selection transistor that is not formed directly on the semiconductor substrate. This structure provides an advantage that the number of laminations can be increased without a major modification to the circuit on the semiconductor substrate.

Thus, the nonvolatile storage device 21 and the method for manufacturing the same according to this example enable a large storage capacity without a complex draw-out from the memory layers, even in the case where the number of laminated memory layers is increased.

Hereinabove, embodiments of the present invention are illustrated using two examples; but methods of practicing the present invention are not confined thereto. Material configurations, including those of the examples, may be appropriately combined. It is apparent that regularly arranged draw-outs of contacts are possible in the case where the number of laminations is increased. Accordingly, the present invention can relatively easily realize high integration by the lamination of resistance change memory.

Third Embodiment

The method for manufacturing a nonvolatile storage device according to a third embodiment of the present invention is the same as that described for the first embodiment.

Figure 15:
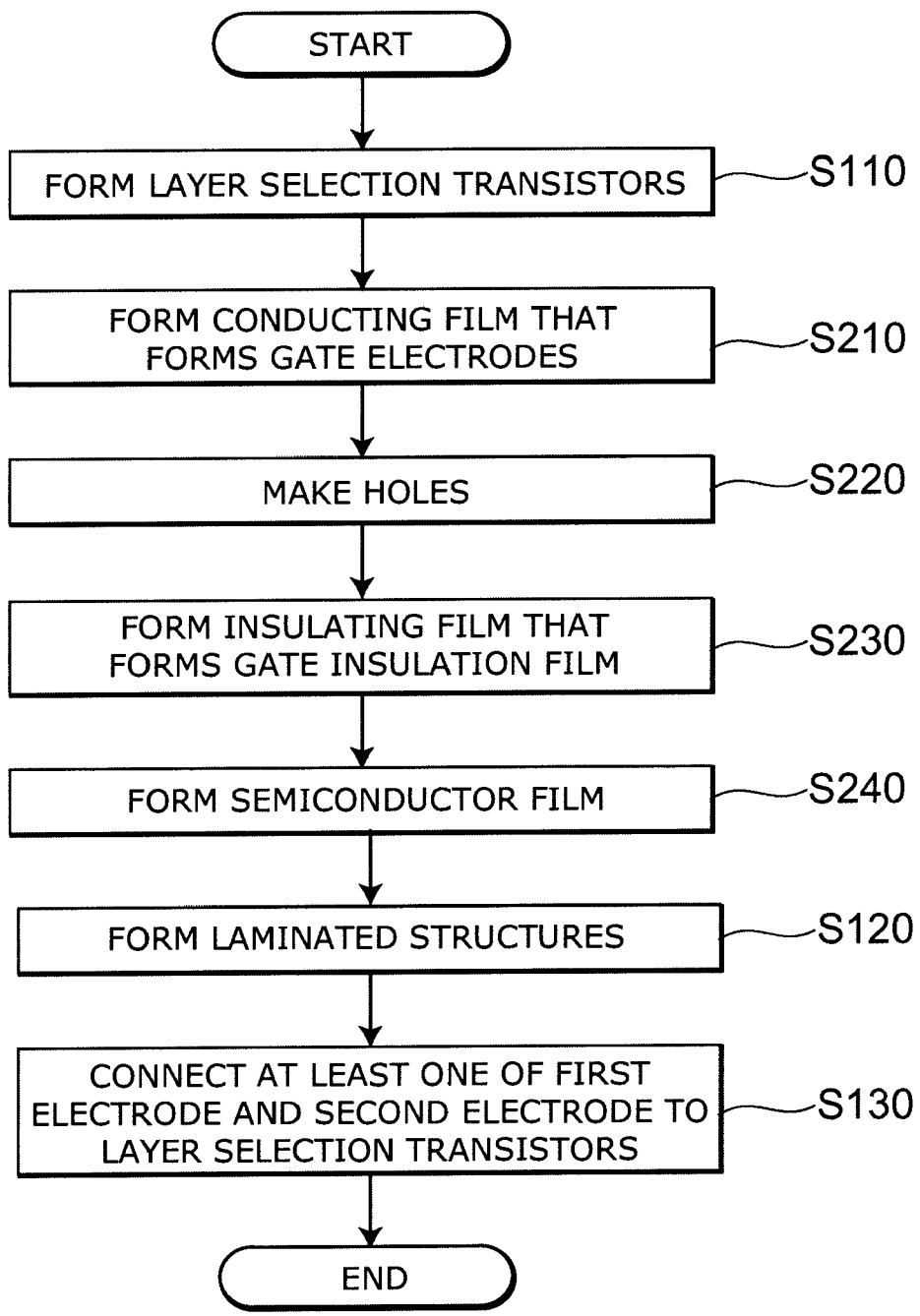
FIG. 15 is a flowchart illustrating a method for manufacturing a nonvolatile storage device according to a third embodiment of the invention.

FIG. 15 is a flowchart illustrating the method for manufacturing the nonvolatile storage device according to the third embodiment of the present invention. The method for manufacturing the nonvolatile storage device according to the third embodiment stacks multiple unit memory layers on one another, wherein each unit memory layer includes a first wiring, a second wiring provided non-parallel to the first wiring, and a recording layer provided between the first wiring and the second wiring.

First, a plurality of layer selection transistors are formed on a semiconductor substrate (step S110) as illustrated in FIG. 15.

Step S110 includes, for example, the following methods.

Figure 16:
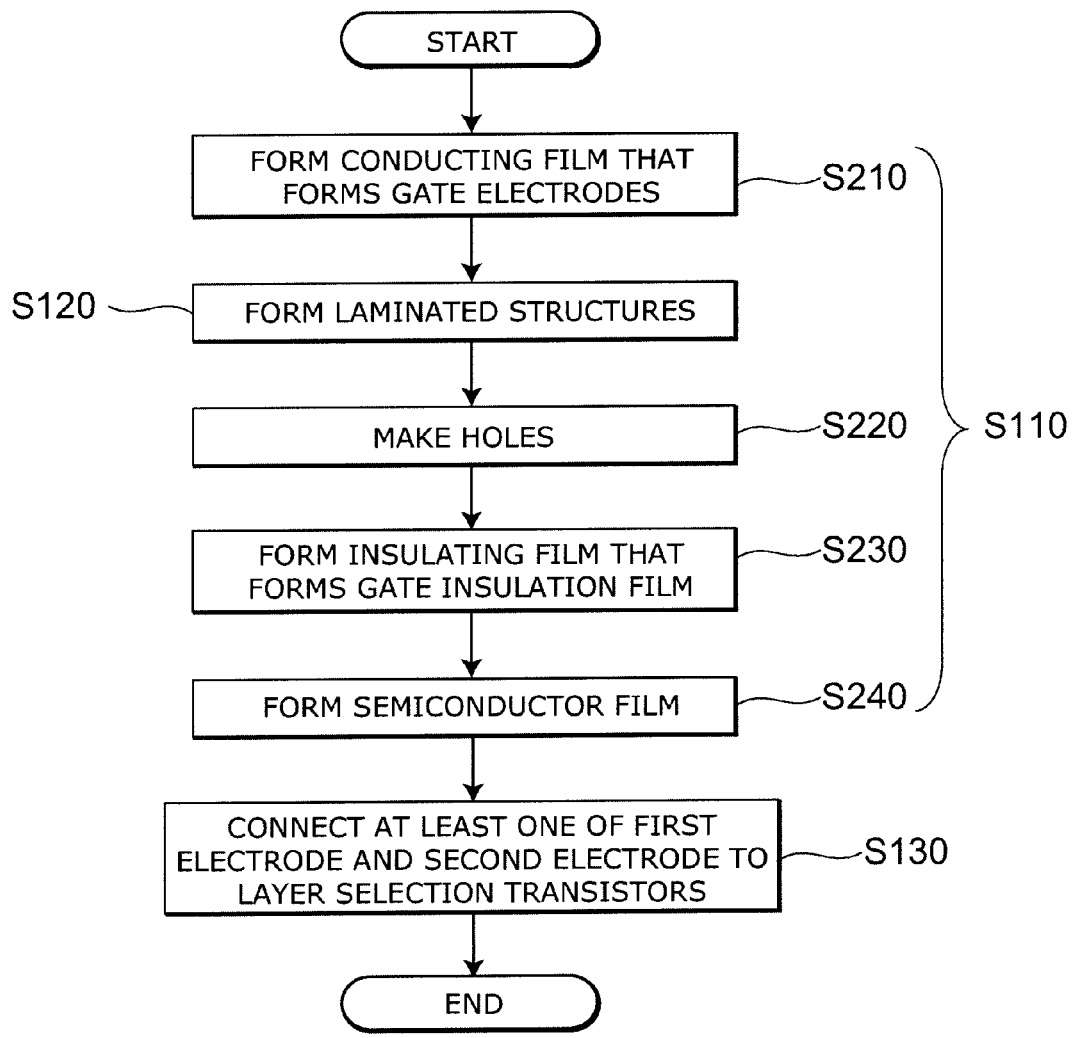
FIG. 16 is a flowchart illustrating another method for manufacturing the nonvolatile storage device according to the third embodiment of the invention.

First as illustrated in FIG. 16, a conductive film that forms gate electrodes of the layer selection transistors is formed (step S210). Then, holes are made to pass completely through the conductive film and communicate with the semiconductor substrate (step S220). An insulating film that forms a gate insulating film of the layer selection transistors is formed inside the holes (step S230). On an inner face of the insulating film, that is, in the remaining space inside the holes, a semiconductor film that forms channels of the layer selection transistors is formed (step S240). Thus, the layer selection transistors are formed.

Continuing after the layer selection transistors are formed, laminated structures that form a unit memory layer are formed (step S120).

The layer selection transistors are connected to at least one of the first wirings and the second wirings of each layer of the unit memory layers, respectively (step S130).

Specifically, the method for manufacturing the nonvolatile storage device of the first example described above may be used.

The steps S110 to S130 and the steps S210 to S240 may be interchanged to the extent of technical feasibility.

In the above description, the recording layer is a layer wherein the resistance changes due to a voltage applied by the first wiring and the second wiring. Alternatively, the recording layer can reversibly transition between a first state and a second state having a different resistance than that of the first state due to a current supplied via the first wiring and the second wiring.

Thus, the layer selection transistors are formed in advance regardless of the number of memory layers to be laminated. Consequently, it is possible to make uniform the characteristics of the layer selection transistors of each layer; and effects of the thermal budget of the transistor formation step on the memory cells can be inhibited.

Thus, the method for manufacturing the nonvolatile storage device according to this embodiment enables a large storage capacity without a complex draw-out from the memory layers, even in the case where the number of laminated memory layers is increased.

The manufacturing method recited above may include modifications such as the following.

FIG. 16 is a flowchart illustrating another method for manufacturing the nonvolatile storage device according to the third embodiment of the present invention.

In the other method for manufacturing the nonvolatile storage device according to this embodiment illustrated in FIG. 16, a conductive film that forms gate electrodes of layer selection transistors is formed first (step S210).

Then, laminated structures that form a unit memory layer are formed (step S120). Holes are made to pass completely through the conductive film formed in step S210 and communicate with the semiconductor substrate (step S220).

An insulating film that forms a gate insulating film of the layer selection transistor is formed inside the holes (step S230).

On an inner face of the insulating film, that is, in the remaining space inside the holes, a semiconductor film that forms a channel of the layer selection transistor is formed (step S240).

Specifically, the method for manufacturing the nonvolatile storage device of the first example described above may be used.

The steps S210 to S240 recited above form the layer selection transistors (step S110).

The layer selection transistors are connected to at least one of the first wirings and the second wirings of each layer of the unit memory layers (step S130).

Thus, the nonvolatile storage device according to an embodiment of the present invention can be manufactured.

This manufacturing method provides vertical layer selection transistors, enabling connections to the layer selection transistors merely by forming contact plugs, even in the case where the number of laminations is increased. An SOI structure can be used as the layer selection transistors, and the layer selection transistors are not formed directly on the substrate. This structure thereby enables an increase of the number of laminations without a major modification to the circuit on the semiconductor substrate. Hence, a transistor can be constructed to prevent short channel effects and provide excellent cut-off characteristics.

Hereinabove, embodiments of the present invention are described with reference to specific examples. However, the present invention is not limited to these specific examples. For example, one skilled in the art may appropriately select specific configurations of components of the nonvolatile storage device and the method for manufacturing the same from known art and similarly practice the present invention. Such practice is included in the scope of the present invention to the extent that similar effects thereto are obtained.

Further, any two or more components of the specific examples may be combined within the extent of technical feasibility; and are included in the scope of the present invention to the extent that the purport of the present invention is included.

Moreover, all nonvolatile storage devices and methods for manufacturing the same that can be obtained by an appropriate design modification by one skilled in the art based on the nonvolatile storage devices and the methods for manufacturing the same described above as embodiments of the present invention also are within the scope of the present invention to the extent that the purport of the present invention is included.

Furthermore, various modifications and alterations within the spirit of the present invention will be readily apparent to those skilled in the art. All such modifications and alterations should therefore be seen as within the scope of the present invention.

The invention claimed is:

1. A nonvolatile storage device comprising:
a plurality of unit memory layers; and
a plurality of layer selection transistors,
wherein the plurality of unit memory layers are laminated in a direction perpendicular to a layer surface of the unit memory layers,
wherein each of the unit memory layers includes:
a plurality of first wirings,
a plurality of second wirings provided non-parallel to the plurality of first wirings, and
a recording layer provided between the plurality of first wirings and the plurality of second wirings,
wherein each of the plurality of layer selection transistors is connected to each of one of the plurality of first wirings and the plurality of second wirings of each of the unit memory layers,
wherein the plurality of layer selection transistors are configured to collectively select some of the one of the plurality of first wirings and the plurality of second wirings of each of the unit memory layers, the selected some being disposed in a common plane, and
wherein the layer selection transistors include a channel along a direction perpendicular to the layer surface of the unit memory layers, and can collectively select the some in a plane perpendicular or parallel to the layer surface.

2. The device according to claim 1, wherein a gate electrode of the layer selection transistor is provided opposite to a face of the channel along the direction perpendicular to the layer surface to surround the channel.

3. A nonvolatile storage device comprising:
a plurality of unit memory layers; and
a plurality of layer selection transistors,
wherein the plurality of unit memory layers are laminated in a direction perpendicular to a layer surface of the unit memory layers,
wherein each of the unit memory layers includes:
a plurality of first wirings,
a plurality of second wirings provided non-parallel to the plurality of first wirings, and
a recording layer provided between the plurality of first wirings and the plurality of second wirings,
wherein each of the plurality of layer selection transistors is connected to each of one of the plurality of first wirings and the plurality of second wirings of each of the unit memory layers,
wherein the plurality of layer selection transistors is configured to collectively select some of the one of the plurality of first wirings and the plurality of second wirings of each of the unit memory layers, the selected some being disposed in a common plane, and
wherein the layer selection transistors include a channel along a direction parallel to the layer surface of the unit memory layer, include a silicon layer provided via an insulating layer on a semiconductor substrate, and can collectively select the some in a plane perpendicular or parallel to the layer surface.

4. The device according to claim 1, wherein the plurality of unit memory layers are provided above a substrate, and the plurality of layer selection transistors are provided between the plurality of unit memory layers and the substrate.

5. The device according to claim 1, wherein gate electrodes of the plurality of layer selection transistors that select the recording layers of the same unit memory layer of the plurality of unit memory layers are mutually electrically connected.

6. The device according to claim 5, wherein
the plurality of first wirings in one of the plurality of unit memory layers, and the plurality of first wirings in another of the plurality of unit memory layers, are connected to a common wiring, or
the plurality of second wirings in one of the plurality of unit memory layers, and the plurality of second wirings in another of the plurality of unit memory layers, are connected to the common wiring.

7. The device according to claim 1, wherein a gate electrode of one of the plurality of layer selection transistors that selects the recording layer of one of the plurality of unit memory layers, and a gate electrode of another of the plurality of layer selection transistors that selects the recording layer of another of the plurality of unit memory layers, are electrically connected.

8. The device according to claim 7, wherein the plurality of first wirings included in the same unit memory layer of the plurality of unit memory layers are connected to the same wiring; or, the plurality of second wirings included in the same unit memory layer of the plurality of unit memory layers are connected to the same wiring.

9. The device according to claim 1, wherein one of the plurality of first wirings and the plurality of second wirings of one of the plurality of unit memory layers is shared as one of the plurality of first wirings and the plurality of second wirings of another of the unit memory layers adjacent to the one of the plurality of unit memory layers in a direction perpendicular to a layer surface of the one of the unit memory layers.

10. The device according to claim 1, wherein the recording layer is a layer wherein a resistance changes due to a voltage applied by the plurality of first wirings and the plurality of second wirings.

11. The device according to claim 1, wherein the recording layer is a layer that can reversibly transition between a first state and a second state having a resistance different from that of the first state due to a current supplied via the plurality of first wirings and the plurality of second wirings.

12. The device according to claim 1, wherein the recording layer includes a layer having at least one selected from the group consisting of C, $NbO_x$, Cr-doped $SrTiO_{3-x}$, $Pr_xCa_yMnO_z$, $ZrO_x$, $NiO_x$, Ti-doped $NiO_x$, $ZnO_x$, $TiO_x$, $TiO_xN_y$, $CuO_x$, $GdO_x$, $CuTe_x$, $HfO_x$, $ZnMn_xO_y$, and $ZnFe_xO_y$; or, a lamination of layers having at least one selected from the group.

13. The device according to claim 1, wherein the recording layer includes a layer having at least one selected from the group consisting of C, $Ge_xSb_yTe_z$, N-doped $Ge_xSb_yTe_z$, O-doped $Ge_xSb_yTe_z$, $Ge_xSb_y$, and $In_xGe_yTe_z$; or, a lamination of layers having at least one selected from the group.

14. The device according to claim 1, wherein at least one of the plurality of first wirings and the plurality of second wirings includes at least one selected from the group consisting of tungsten nitride, titanium nitride, titanium aluminum nitride, tantalum nitride, titanium silicide nitride, tantalum carbide, titanium silicide, tungsten silicide, cobalt silicide, nickel silicide, nickel platinum silicide, platinum, ruthenium, platinum-rhodium, and iridium.

15. The device according to claim 1, wherein each of the unit memory layers further includes a rectifying element provided between a recording layer and at least one of the plurality of first wirings and the plurality of second wirings, the rectifying element including at least one selected from the group consisting of silicon, germanium, NiO, TiO, CuO, and InZnO.

16. A method for manufacturing a nonvolatile storage device, the nonvolatile storage device including a plurality of unit memory layers laminated in a direction perpendicular to a layer surface of the plurality of unit memory layers, and each of the plurality of unit memory layers including a first wiring, a second wiring provided non-parallel to the first wiring, and a recording layer provided between the first wiring and the second wiring; comprising:
    forming a plurality of layer selection transistors on a semiconductor substrate;
    forming the unit memory layers; and
    connecting one of the first wirings and the second wirings in each layer in the unit memory layers to the layer selection transistors, respectively,
    the forming the plurality of layer selection transistors including forming a channel of the layer selection transistor, the channel being along a direction perpendicular to the layer surface of the unit memory layers, and
    the plurality of layer selection transistors being able to collectively select the some in a plane perpendicular or parallel to the layer surface.

17. The method for manufacturing a device according to claim 16, further comprising:
    forming a plurality of silicon layers connected to at least one of the first wiring and the second wiring of each layer of the unit memory layers, respectively,
    the forming the layer selection transistors including:
        exposing a side face of the plurality of silicon layers perpendicular to a major surface of the semiconductor substrate;
        forming a gate insulating film on the exposed side face; and
        forming a gate electrode to connect a plurality of the unit memory layers provided along a plane perpendicular to the major surface of the semiconductor substrate via the gate insulating film on the side face.

18. The method for manufacturing a device according to claim 16, wherein the forming the layer selection transistors includes:
    forming a conductive film that forms a gate electrode of the layer selection transistor;
    making a hole to pass completely through the conductive film and communicate with the semiconductor substrate;
    forming an insulating film that forms a gate insulating film of the layer selection transistor on an inner face of the hole; and
    forming a semiconductor film that forms the channel of the layer selection transistor in a remaining space of the hole.

19. The method for manufacturing a device according to claim 18, wherein the step of forming the layer selection transistors further includes removing the insulating film formed on the inner face of the hole from a bottom of the hole.

* * * * *